(12) United States Patent
Oonishi

(10) Patent No.: US 7,116,215 B2
(45) Date of Patent: Oct. 3, 2006

(54) SENSOR DEVICE AND CERAMIC PACKAGE FOR MOUNTING ELECTRONIC COMPONENTS

(75) Inventor: Jun Oonishi, Mizuho (JP)

(73) Assignee: Denso Corporation, Kariya (JP)

( * ) Notice: Subject to any disclaimer, the term of this patent is extended or adjusted under 35 U.S.C. 154(b) by 123 days.

(21) Appl. No.: 10/765,882

(22) Filed: Jan. 29, 2004

(65) Prior Publication Data

US 2004/0201464 A1    Oct. 14, 2004

(30) Foreign Application Priority Data

| Feb. 3, 2003 | (JP) | ............................. 2003-025866 |
| Feb. 3, 2003 | (JP) | ............................. 2003-025872 |
| Feb. 3, 2003 | (JP) | ............................. 2003-025876 |
| Feb. 3, 2003 | (JP) | ............................. 2003-025882 |
| Feb. 25, 2003 | (JP) | ............................. 2003-047378 |
| May 6, 2003 | (JP) | ............................. 2003-128265 |

(51) Int. Cl.
*B60Q 1/00* (2006.01)

(52) U.S. Cl. ............... 340/436; 340/429; 340/665

(58) Field of Classification Search ........... 340/436
See application file for complete search history.

(56) References Cited

U.S. PATENT DOCUMENTS

| 3,485,262 A | * | 12/1969 | Benno .................... 340/515 |
| 4,829,822 A | * | 5/1989 | Imai et al. ............... 73/514.12 |
| 4,966,031 A | * | 10/1990 | Mochizuki ............... 73/35.11 |
| 5,554,806 A | * | 9/1996 | Mizuno et al. .......... 73/493 |
| 5,633,461 A | | 5/1997 | Kakizaki et al. |
| 5,714,409 A | * | 2/1998 | Parsons ................... 430/51 |
| 5,898,218 A | | 4/1999 | Hirose |
| 6,439,359 B1 | * | 8/2002 | Kato et al. .............. 188/379 |
| 6,667,664 B1 | | 12/2003 | Akagawa et al. |
| 6,720,361 B1 | * | 4/2004 | Tasaka et al. .......... 521/54 |

FOREIGN PATENT DOCUMENTS

| DE | 195 03 778 | 8/1996 |
| EP | 0 261 555 | 3/1988 |
| JP | 55102255 A * | 8/1980 |
| JP | 2003-28890 | 1/2003 |
| WO | WO 92/20096 | 11/1992 |
| WO | WO 01/58007 A1 | 8/2001 |
| WO | WO 02061373 | 8/2002 |

OTHER PUBLICATIONS

EPO Communication and Search Report dated Aug. 23, 2005.
Office Communication dated Apr. 17, 2006 issued from Japanese Patent Office for counterpart application of JP-A-2003-047378 and its English translation.

* cited by examiner

*Primary Examiner*—Daniel Wu
*Assistant Examiner*—Eric M. Blount
(74) *Attorney, Agent, or Firm*—Posz Law Group, PLC

(57) ABSTRACT

A sensor device includes a G sensor producing an electric signal in accordance with physical displacement of its sensing portion and a casing mounting this G sensor. A casing chamber is sealed with a potting material so that the G sensor is covered with the potting material. The potting material has the role of surely damping the high-frequency vibration which generally causes resonance. Thus, the G sensor can accurately detect the collision and vibration without being adversely influenced by the resonance.

27 Claims, 22 Drawing Sheets

MODEL CONSISTING OF G SENSOR
AND VIBRATION PROOFING MATERIAL

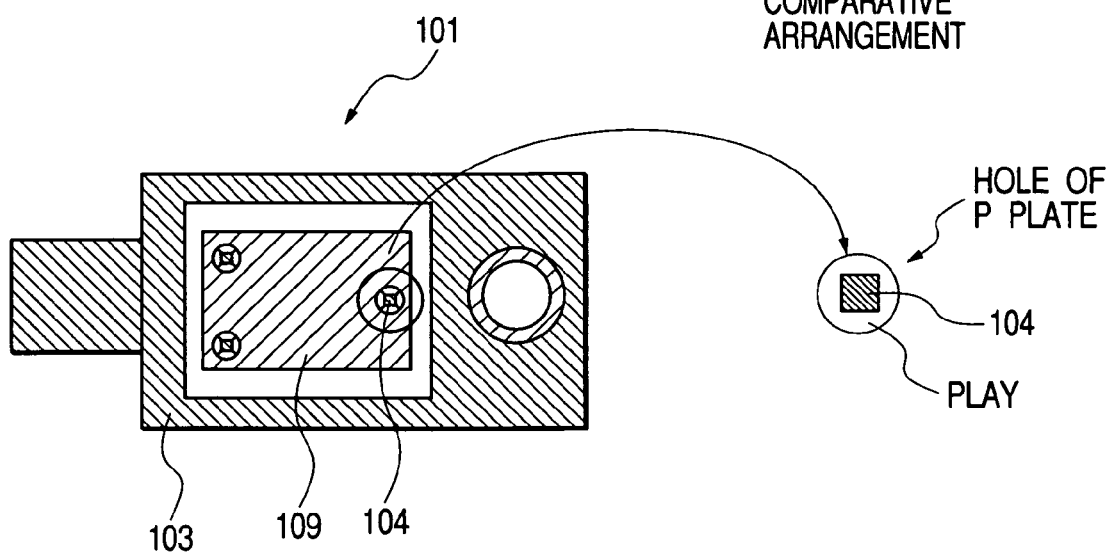
FIG. 16B
COMPARATIVE ARRANGEMENT
FIG. 16C
COMPARATIVE ARRANGEMENT
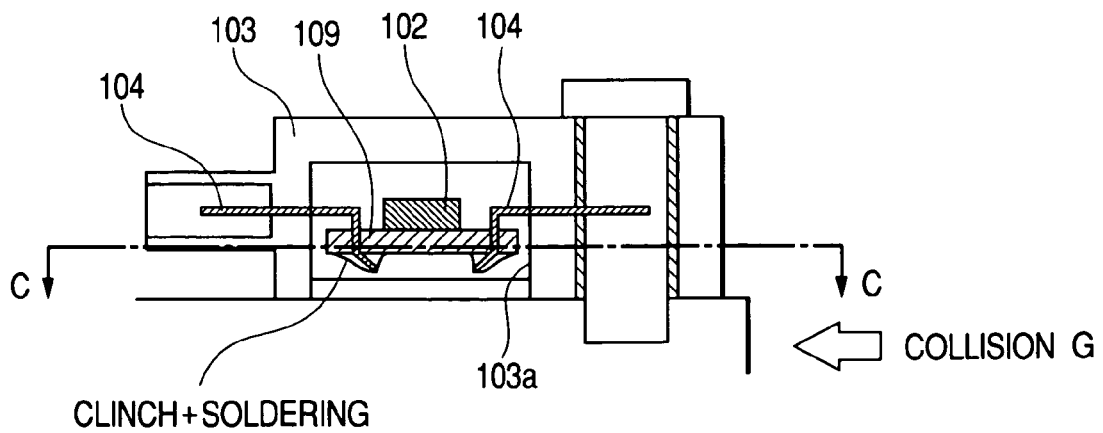
FIG. 16A
COMPARATIVE ARRANGEMENT

COMPARATIVE ARRANGEMENT

COMPARATIVE ARRANGEMENT

HORIZONTAL MOUNTING

VERTICAL MOUNTING

COMPARATIVE ARRANGEMENT

COMPARATIVE ARRANGEMENT

SENSOR DEVICE AND CERAMIC PACKAGE FOR MOUNTING ELECTRONIC COMPONENTS

BACKGROUND OF THE INVENTION

This invention relates to a sensor device mounting an electronic sensor which is capable of detecting collision, vibration, angular acceleration, or the like based on an electric signal produced in accordance with physical displacement of a sensing portion.

Furthermore, this invention relates to a ceramic package for mounting electronic components.

SUMMARY OF THE INVENTION

The present invention has an object to provide a sensor device which is capable of surely damping high-frequency vibration, i.e., the cause of resonance, to realize accurate detection of collision and vibration.

In order to accomplish the above and other related objects, the present invention provides a first sensor device including an electronic sensor for outputting an electric signal in accordance with physical displacement of a sensing portion, and a casing in which the electronic sensor is mounted, wherein a vibration damping member capable of damping high-frequency vibration is provided between at least part of the electronic sensor and the casing.

According to this arrangement, although the electronic sensor outputting an electric signal in accordance with the physical displacement of the sensing portion has a resonance point in a high-frequency band (for example, in the frequency band equal to or higher than 1 kHz), the vibration damping member provided between at least part of the electronic sensor and the casing surely suppresses or eliminates the high-frequency vibration which generally causes resonance. Thus, the first sensor device can accurately detect collision, vibration, angular acceleration, or the like without being adversely influenced by the resonance.

Furthermore, according to the present invention, it is preferable that the vibration damping member is a potting material, and the electronic sensor is surrounded by the potting material.

According to this arrangement, the potting material surrounding the electronic sensor surely suppresses or eliminates the high-frequency vibration which generally causes resonance. Furthermore, when used for surrounding the electronic sensor, the potting material brings the effects of maintaining appropriate airtightness and removing the cause of moisture and corrosion. The potting material is, for example, a silicone potting material, a urethane potting material, or the like.

Furthermore, according to the present invention, it is preferable that the vibration damping member is a plate or sheet vibration proofing material or a molded vibration proofing material integrated together with the electronic sensor, and the electronic sensor is fixed to the casing via the vibration proofing material.

According to this arrangement, the electronic sensor is fixed to the casing via the plate or sheet vibration proofing material or the molded vibration proofing material integrated together with the electronic sensor. Hence, the vibration proofing material surely suppresses or eliminates the high-frequency vibration which generally causes resonance.

Furthermore, according to the present invention, it is preferable that the vibration damping member is a lead member having elasticity which is connected to the electronic sensor at least at a portion thereof and is fixed to the casing at least at the other portion thereof, and the lead member and the electronic sensor are arranged so as to cooperatively constitute a spring-mass system consisting of spring of the lead member and mass of the electronic sensor for damping high-frequency vibration.

According to this arrangement, the electronic sensor is connected to at least part of the elastic lead member and at least other portion of this lead member is fixedly supported to the casing. Thus, the spring-mass system consisting of spring of the lead member and mass of the electronic sensor effectively suppresses or eliminates the high-frequency vibration.

Furthermore, according to the present invention, it is preferable that the lead member is integrally molded with the casing.

According to this arrangement, the lead member is integrally molded with the casing and hence the electronic sensor is accurately positioned with respect to the detecting direction of collision and vibration. The detection of collision and vibration can be accurately performed.

Furthermore, according to the present invention, it is preferable that the electronic sensor includes a detecting portion, a communicating portion, and an electric power source circuit integrated together as one package, and is directly attached to the casing.

According to this arrangement, the detecting portion, the communicating portion, and the electric power source circuit, cooperatively constituting the electronic sensor, are integrated into one package and directly attached to the casing without using a substrate. Thus, it becomes possible to simplify the assembling processes and reduce the total number of parts. Cost reduction can be realized. Furthermore, as the electronic sensor is directly attached to the casing, direct transmission of vibration is realized. Thus, it is very important to suppress or eliminate the high-frequency vibration by using the vibration damping member.

Furthermore, according to the present invention, it is preferable that the electronic sensor is mounted on a substrate, and the substrate is attached to the casing.

According to this arrangement, the vibration damping member interposing between the electronic sensor mounted on the substrate and the casing surely suppresses or eliminates the high-frequency vibration which generally causes resonance.

Furthermore, according to the present invention, it is preferable that setting of physical properties including hardness and dielectric dissipation factor, as well as shape and size of the vibration damping member is determined so as to enhance damping properties in high-frequency vibration including a resonance point of the electronic sensor.

According to this arrangement, it becomes possible to surely suppress or eliminate the high-frequency vibration including the resonance point of the electronic sensor by adequately setting the physical properties including hardness and dielectric dissipation factor, as well as shape and size of the vibration damping member. Furthermore, without changing the external size and shape of the casing or the like, it becomes possible to change or adjust the vibration transfer characteristics of the casing to desired characteristics. It becomes possible to unify the outer shape of the casing. The cost reduction of the casing is feasible. No mounting design is necessary.

Furthermore, the present invention has an object to provide an electronic component mounting ceramic package equipped with a metallic electrode to which a lead or the like can be later welded even after electronic circuit or the like is assembled.

In order to accomplish the above and other related objects, the present invention provides an electronic component mounting ceramic package for mounting electronic components, wherein a metallic electrode allowing post-welding is provided on a main body of the ceramic package.

According to this invention, the main body of the ceramic package is provided with the metallic electrode allowing post-welding. Accordingly, even after a circuit chip or other electronic components are mounted on the ceramic package, a lead can be firmly bonded by welding to the metallic electrode for the connection to other member (e.g., glass epoxy substrate, connector terminal, or the like).

Furthermore, according to the electronic component mounting ceramic package, it is desirable the metallic electrode is brazed to the main body of the ceramic package.

Employing brazing for bonding the metallic electrode to the main body of the ceramic package assures excellent bonding strength and therefore makes it possible to later weld the lead to the metallic electrode.

Furthermore, to satisfy recent regulations and ratings relating to vehicle collision safety, the rate of airbags installed into vehicles is increasing. Furthermore, application of the collision detecting sensor devices is not only for front collision detection of the vehicle but also for side collision detection of the vehicle. Accordingly, the number of collision detecting sensor devices per vehicle is increasing. It is therefore important to reduce the manufacturing costs for these sensor devices.

Thus, the present invention has an object to provide a sensor device which is capable of surely damping high-frequency vibration, i.e., the cause of resonance, and is easily manufactured at low cost.

In order to accomplish the above and other related objects, the present invention provides a second sensor device including an electronic sensor for outputting an electric signal in accordance with physical displacement of a sensing portion, and a casing in which the electronic sensor is mounted, wherein the casing includes a primary molded portion formed by primary molding so as to surround the electronic sensor with a first resin material capable of damping high-frequency vibration, and a secondary molded portion formed by secondary molding so as to surround the primary molded portion with a second resin material harder than the first resin material.

According to this arrangement, although the electronic sensor outputting an electric signal in accordance with the physical displacement of the sensing portion has a resonance point in a high-frequency band (for example, in the frequency band equal to or higher than 1 kHz), the surrounding of the electronic sensor is formed by primary molding with the first resin material capable of damping high-frequency vibration, thereby surely damping the high-frequency vibration which generally causes resonance. Thus, the second sensor device can accurately detect collision, vibration, angular acceleration, or the like without being adversely influenced by the resonance. Furthermore, the surrounding of the primary molded portion is formed by secondary molding with the second resin material harder than the first resin material. The strength is excellent. Even when the sensor device is disposed in an en engine room located at the front part of a vehicle body or in a crush zone (i.e., corruptible region), such as a pillar, located at the side portion, of the vehicle body, it is possible to prevent the casing from being damaged in case of external collision.

Furthermore, at the time the primary molding and the secondary molding are accomplished, the assembling of the sensor device is accomplished. In other words, a conventionally required post-assembling process for installing the electronic sensor into the casing can be omitted. The manufacturing man-hours can be reduced. The second sensor device can be constituted by a minimum number of requisite components. The manufacturing cost can be greatly reduced.

Furthermore, according to the second sensor device, it is desirable that the first resin material is a liquid-state silicone rubber.

According to this arrangement, the electronic sensor is surrounded by primary molding with the liquid-state silicone rubber which is a soft resin material. Thus, it becomes possible to surely damp the high-frequency vibration.

Furthermore, to accomplish the above and other related objects, the present invention provides a third sensor device including an electronic sensor for outputting an electric signal in accordance with physical displacement of a sensing portion, and a casing in which the electronic sensor is mounted, wherein the casing is made of a resin material containing a vibration damping material capable of damping high-frequency vibration.

According to this arrangement, although the electronic sensor outputting an electric signal in accordance with the physical displacement of the sensing portion has a resonance point in a high-frequency band (for example, in the frequency band equal to or higher than 1 kHz), the casing made of the resin material containing a vibration damping material is capable of surely damping high-frequency vibration which generally causes resonance. Thus, the sensor device can accurately detect collision, vibration, angular acceleration, or the like without being adversely influenced by the resonance.

Furthermore, according to the third sensor device, it is preferable that the electronic sensor is integrally molded with the resin material containing the vibration damping material.

Accordingly, employment of the resin material containing the vibration damping material for integrally molding the electronic sensor brings the effect of surely damping the high-frequency vibration which generally causes resonance. Furthermore, at the time the integral molding of the electronic sensor is accomplished, the assembling of the sensor device is accomplished. In other words, a conventionally required post-assembling process for installing the electronic sensor into the casing can be omitted. The manufacturing man-hours can be reduced. The sensor device can be constituted by a minimum number of requisite components. The manufacturing cost can be greatly reduced.

Furthermore, according to the third sensor device, it is desirable that the vibration damping material is a thermoplastic elastomer.

Accordingly, the casing made of a resin material containing the thermoplastic elastomer having excellent elasticity can surely damp the high-frequency vibration which generally causes resonance.

Furthermore, to accomplish the above and other related objects, the present invention provides a fourth sensor device including an electronic sensor for outputting an electric signal in accordance with physical displacement of a sensing portion, and a casing in which the electronic sensor is mounted, wherein a dynamic damper is attached to the electronic sensor, and the dynamic damper is tuned to a resonance point of the sensing portion.

According to this arrangement, although the electronic sensor outputting an electric signal in accordance with the physical displacement of the sensing portion has a resonance point in a high-frequency band (for example, in the frequency band equal to or higher than 1 kHz), the dynamic damper being tuned to the resonance point of the sensing portion and attached to the electronic sensor is capable of surely damping high-frequency vibration which generally causes resonance. Thus, the sensor device can accurately detect collision, vibration, angular acceleration, or the like without being adversely influenced by the resonance.

Furthermore, according to the fourth sensor device, it is preferable that the dynamic damper is made of a plate or sheet elastic member.

Accordingly, by adopting a simple arrangement such that the plate or sheet elastic member is attached to the electronic sensor, it becomes possible to surely damping high-frequency vibration which generally causes resonance.

BRIEF DESCRIPTION OF THE DRAWINGS

The above and other objects, features and advantages of the present invention will become more apparent from the following detailed description which is to be read in conjunction with the accompanying drawings, in which:

FIG. 16A is a side view showing a comparative collision detecting sensor device;

FIG. 16B is cross-sectional view of the comparative sensor device taken along a line C—C of FIG. 16A;

FIG. 16C is an enlarged view chiefly showing a connector terminal installation hole opened on a P plate of the comparative sensor device;

FIGS. 25A and 25B are side views showing the schematic arrangement of a G sensor device in accordance with another example of the fourth embodiment of the present invention, in which FIG. 25A is a horizontal mounting for a circuit device and FIG. 25B is a vertical mounting for the circuit device;

DESCRIPTION OF THE PREFERRED EMBODIMENTS

Comparative Arrangement (I)

Before explaining preferred embodiments of the present invention, various examples will be explained hereinafter for comparison.

Figure 17:
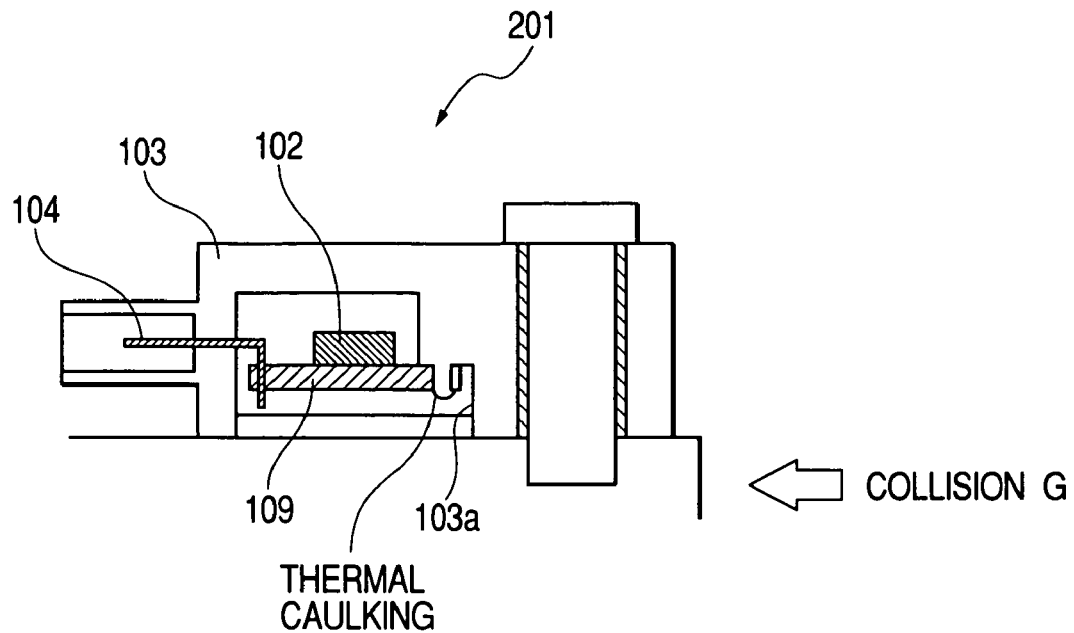
FIG. 17 is a side view showing the schematic arrangement of another comparative collision detecting sensor device.
Figure 18:
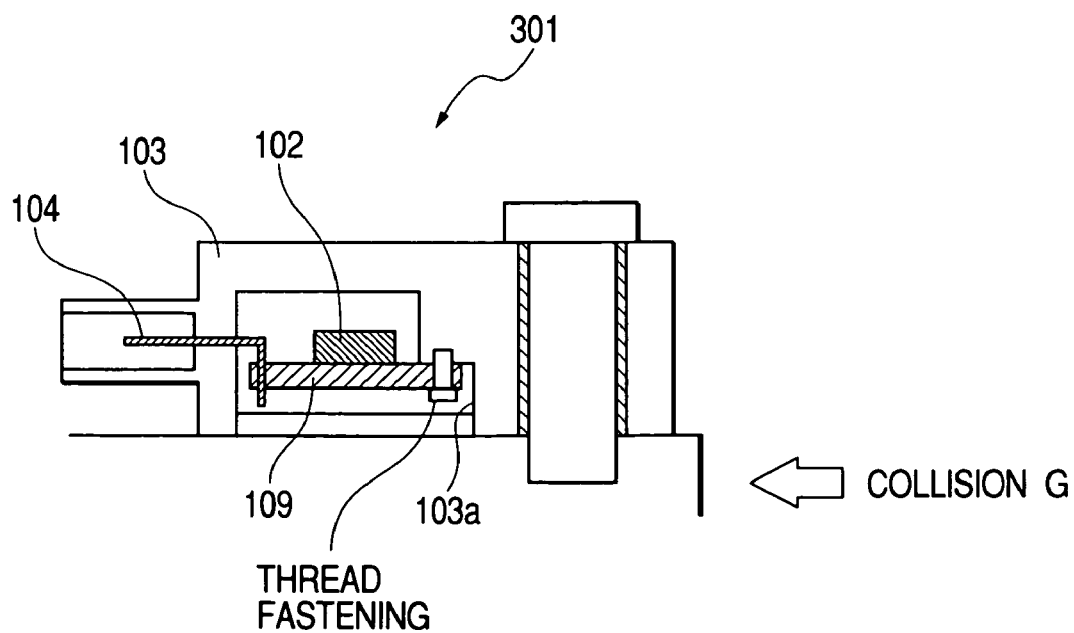
FIG. 18 is a side view showing the schematic arrangement of yet another comparative collision detecting sensor device.

Collision detecting sensor devices for detecting collision or vibration are generally mounted on the front part of a vehicle to use the detected signal for inflating or expanding an airbag in case of vehicle collision. For example, FIGS. 16A–16C and 17 respectively show the fixing structure for a collision detecting sensor device. According to a collision detecting sensor device 101 shown in FIGS. 16A–16C, a G sensor 102 is mounted on a P plate (e.g., a glass epoxy substrate) 109. The P plate 109 is located inside a G sensor chamber 103a of a resin-made casing 103 and is clinched to a connector terminal 104 fixed to the casing 103 and bonded by soldering. According to a collision detecting sensor device 201 shown in FIG. 17, the P plate 109 is fixed to the casing 103 by thermal caulking. According to a collision detecting sensor device 301 shown in FIG. 18, the P plate 109 is fixed to the casing 103 by means of a bolt. The G sensor 102 is arranged so as to detect collision or vibration based on an electric signal produced in accordance with physical displacement, such as deformation or shifting, of a sensing portion (not shown). Hence, this structure inevitably possesses a specific frequency (i.e., resonance point) at which the resonance occurs.

The above-described structure of the collision detecting sensor device 101 or 201 has the capability of damping high-frequency vibration, which generally induces the resonance, to a certain degree due to function of the P plate 109. However, the obtainable damping effect is variable depending on the material, size, and rigidity of P plate 109, and also depending on its weight including G sensor 102, as well as the fixing method of P plate 109 and the fixing position of P plate 109 relative to the casing 103. In actual product design of the P plate 109, its material, size, rigidity, and weight including G sensor 102 are substantially determined according to a circuit scale. The fixing method of P plate 109 and the fixing position of P plate 109 relative to the casing 103 are determined according to the size of P plate 109. In other words, it is not always possible for the above-described structures to assure the effect for damping high-frequency vibration.

Furthermore, it is assumed that the resonance point of a sensing portion (not shown) of G sensor 102 mounted on the P plate 109 may agree with the resonance point of casing 103. In such a case, when the input high-frequency vibration includes the resonance point, the resonance of G sensor 102 will overlap with the resonance of casing 103. The G sensor 102 will produce a detection value fairly larger than the input G. Thus, accurate collision judgment will be unfeasible.

Figure 19A:
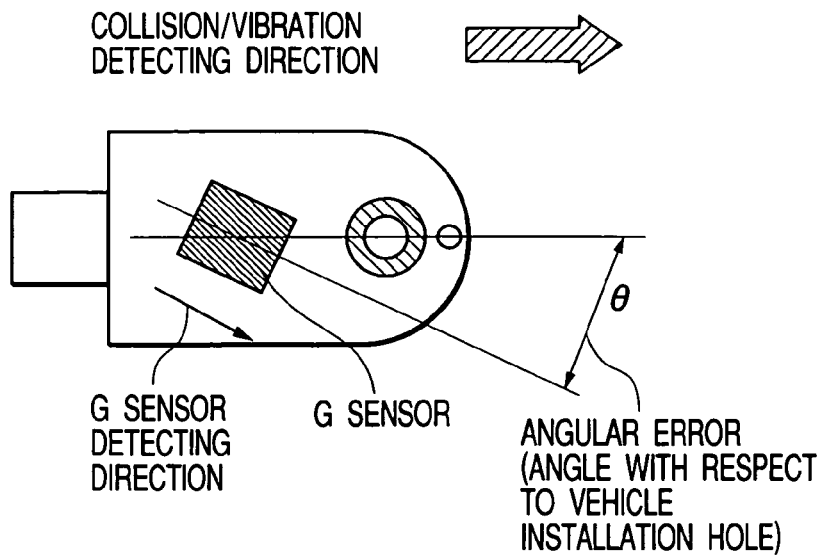
FIG. 19A is a plan view explaining an angular error appearing in the horizontal direction and FIG. 19B is a side view explaining an angular error appearing in the up-and-down direction, with respect to the installation of the G sensor according to the comparative collision detecting sensor device.
Figure 19B:
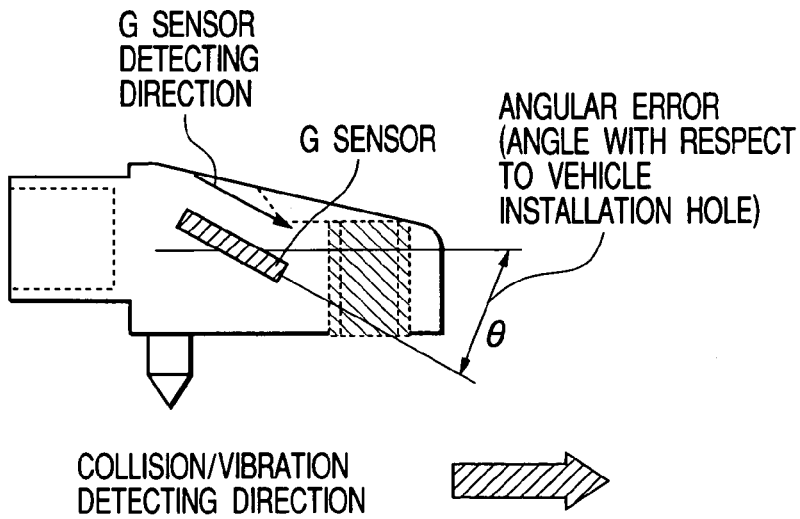
Figure 20:
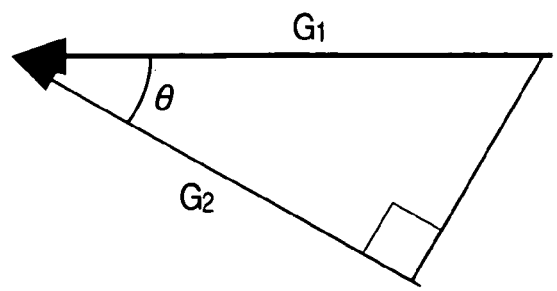
FIG. 20 is a view showing the relationship between an input collision vibration and an actually detected collision vibration in the case that the G sensor has an angular error in its installation.

Furthermore, for example, according to the collision detecting sensor device 101 shown in FIGS. 16A–16C, location errors corresponding to precision of dies will be caused in the process of inserting the connector terminal 104 into the casing 103. Furthermore, for assuring installability, a significant play is usually provided between an engagement hole of the P plate 109 and the connector terminal 104. Thus, location errors corresponding to this play will be caused in the process of assembling the P plate 109 with the connector terminal 104 (refer to FIGS. 16B and 16C). For example, these location errors cause an angular error θ in the direction of detecting collision vibration with reference to the vehicle installation hole. FIG. 19A shows a case in which the angular error θ is caused in the horizontal direction. FIG. 19B shows a case in which the angular error θ is caused in the up-and-down direction. It is now supposed that G1 represents the magnitude of collision vibration entered into the collision detecting sensor device 101 and G2 represents the magnitude of collision vibration actually detected by a G sensor 102. When the G sensor 102 is faced toward the angle θ with respect to the collision detecting direction, the magnitude of collision vibration actually detected by the G sensor 102 is expressed by the equation $G2=G1 \times \cos\theta$ (refer to FIG. 20). As apparent from this equation, the collision detecting ability of the collision detecting apparatus 101 decreases with increasing angular error θ of the G sensor 102.

First Embodiment

Hereinafter, preferred embodiments of a collision detecting sensor device embodying the sensor device of the present invention will be explained with reference to the attached drawings.

Figure 1:
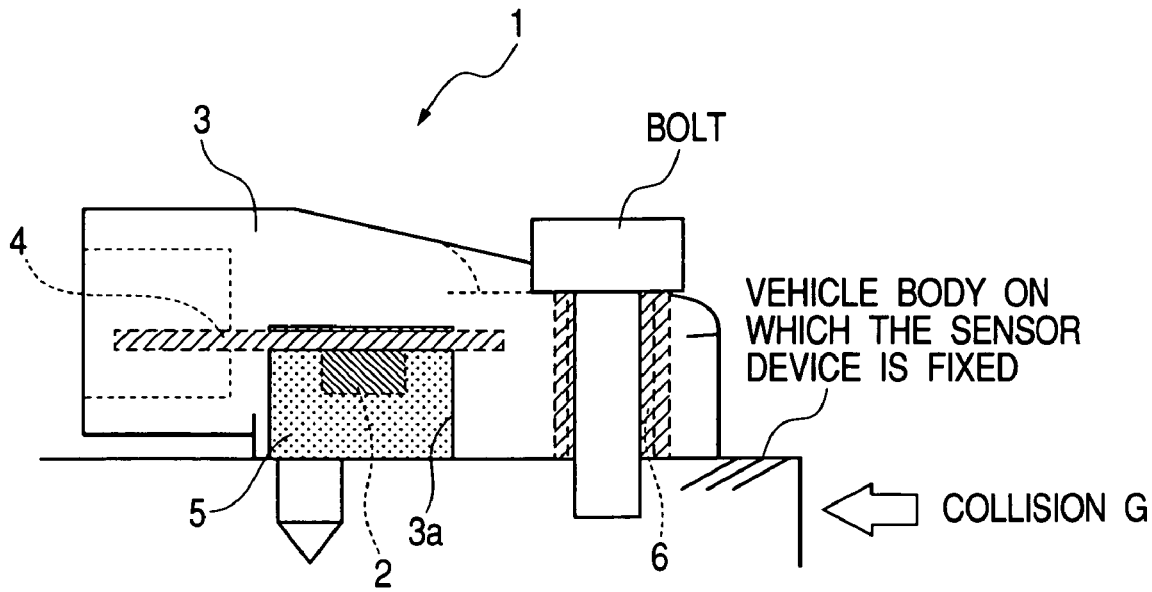
FIG. 1 is a side view showing the schematic arrangement of a collision detecting sensor device in accordance with a first embodiment of the present invention.

First of all, a collision detecting sensor device (hereinafter, referred to as sensor device) 1 in accordance with a first embodiment of the present invention will be explained with reference to FIG. 1. The sensor device 1 is chiefly composed of a G sensor 2 and a casing 3, and is mounted at the front part of a vehicle body or the like to detect collision and output a collision detecting signal to an airbag control apparatus.

Figure 2:
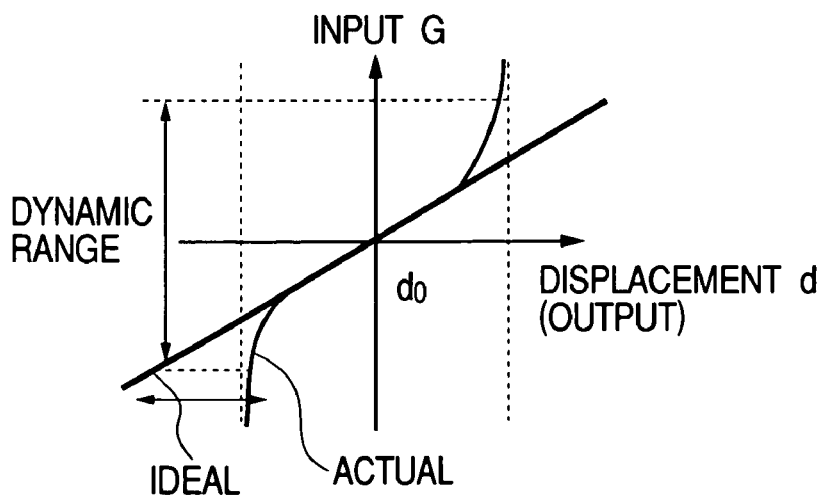
FIG. 2 is a graph showing one example of G detection output characteristics of the G sensor.

Although not shown, the G sensor 2 includes a sensing portion (i.e., a detecting portion) and is arranged to produce an electric signal representing a physical displacement (shift, deformation, etc) of the sensing portion when an acceleration (hereinafter, simply referred to as "G") is entered. Although it is desirable that the G sensor 2 can detect the entire range of the input G, the actual detection range of the G sensor 2 is limited to a predetermined dynamic range (i.e., the range of detectable input G) as shown in FIG. 2. When an input acceleration exceeding this dynamic range is applied, the G sensor 2 cannot detect this acceleration accurately. Furthermore, the G sensor 2 has an inherent resonance point (which is also referred to as resonance frequency) determined according to its structural features. Accordingly, when the input acceleration includes a frequency component corresponding to the resonance point of the G sensor 2, the detecting portion of the G sensor 2 may cause large movement exceeding the dynamic range of the G sensor 2. At this moment, the G sensor 2 cannot perform the detection accurately. The G sensor 2 is, for example, a comb-teeth type G sensor which is arranged so as to detect the acceleration in accordance with a shift amount of the sensing portion. Furthermore, the G sensor 2 of this embodiment includes a detecting portion, a communicating portion, and an electric power source circuit which are integrated into one package.

The casing 3 is a resin molded product in which the G sensor 2 is mounted. For example, the casing 3 is made of a PBT (polybutylene terphthalate) resin, nylon resin, or the like. The casing 3 has a G sensor chamber 3a which opens toward a lower surface side of the casing 3. A connector terminal 4 and a cylindrical metal bush 6 are embedded in the casing 3. The G sensor 2 is electrically connected to the outside via the connector terminal 4. A bolt is inserted into the metal bush 6 to fix the casing 3 to a vehicle body. Part of the connector terminal 4 is exposed inside the G sensor chamber 3a. The G sensor 2 is located in the G sensor chamber 3a and is fixed to the connector terminal 4 by soldering or the like for providing electrical connection.

The connector terminal 4 is electrically connected to an airbag control apparatus (not shown) via a conductor (not shown), so that an output signal of the G sensor 2 is supplied to the airbag control apparatus. The airbag control apparatus controls expansion of an airbag (not shown) based on the output signal of the G sensor 2.

Furthermore, the inside space of G sensor chamber 3a of the casing 3 is sealed with a potting material 5. More specifically, the G sensor 2 placed inside the G sensor chamber 3a and connected to the connector terminal 4 by soldering is surrounded by the potting material 5. The space intervening between the G sensor 2 and an inner wall of the casing 3 forming the G sensor chamber 3a is filled with the potting material 5. The potting material 5 is, for example, a silicone potting material, a urethane potting material, or the like.

The sensor device 1 is fixed to the vehicle body by tightening a bolt inserted into the metal bush 6 embedded in the casing 3.

Next, functions of various portions, in the sensor device 1 having the above-described arrangement, for detecting the collision will be explained with reference to the drawings.

Figure 3:
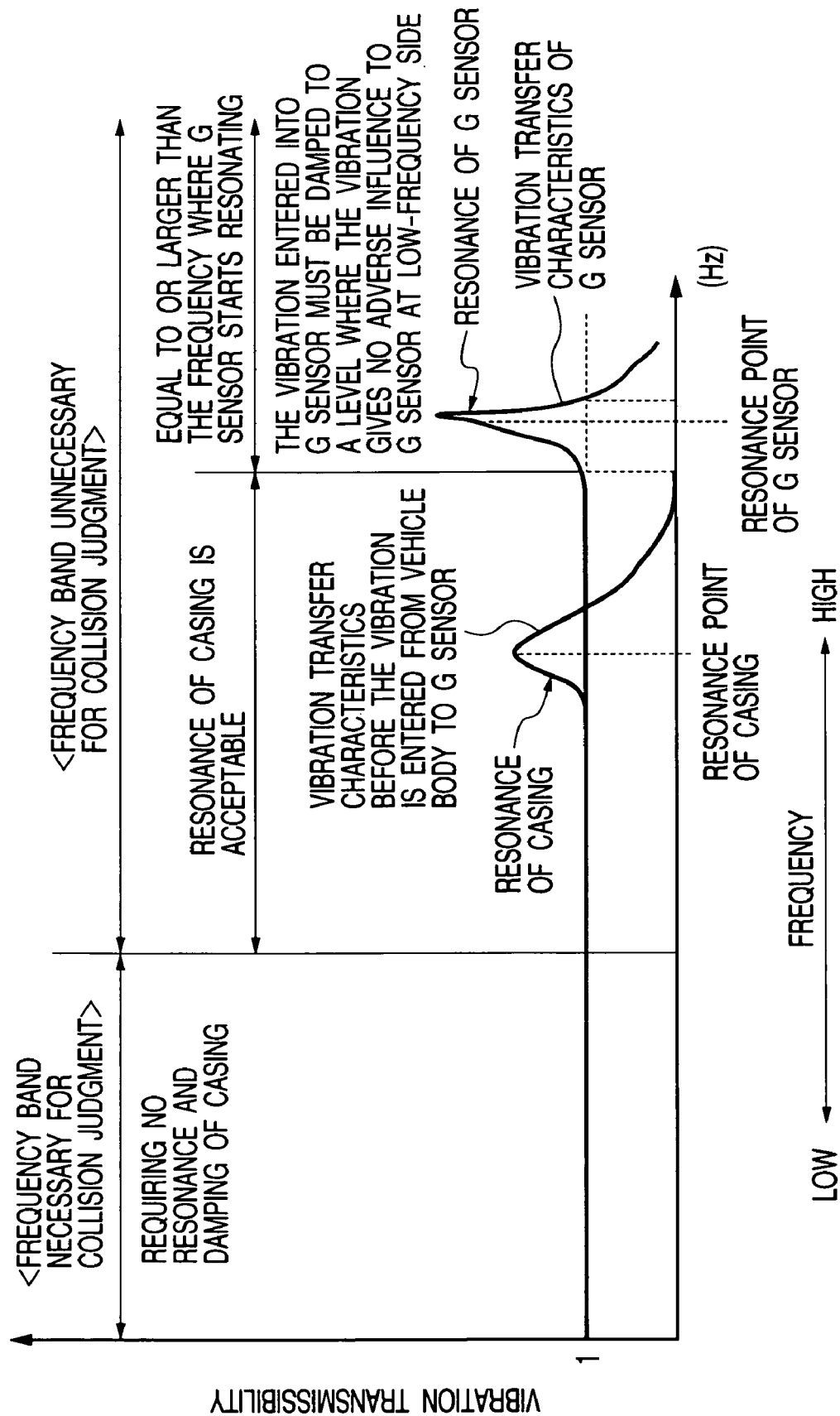
FIG. 3 is a graph showing the relationship between vibration transmissibility and vibration frequency in each of the G sensor and the casing.
Figure 4:
FIG. 4 is a view showing the sequential flow stating from input of collision G vibration and ending by output of sensor signal.

The vibration entered into sensor device 1 in case of vehicle collision or the like includes a variety range of frequency components. The frequency components are roughly classified into two groups; i.e., a group of frequency components necessary for vehicle collision judgment (chiefly residing in a low-frequency band, for example the frequency components less than 1 kHz) and a group of frequency components unnecessary for the collision judgment (chiefly residing in a high-frequency band, for example the frequency components equal to or higher than 1 kHz), as shown in FIG. 3. Furthermore, the G sensor 2 (more specifically, the sensing portion) has a resonance point belonging to the high-frequency band. The casing 3 has a resonance point being set to a frequency level different from the resonance point of the G sensor 2 (according to the example shown in FIG. 3, the resonance point of casing 3 is lower than the resonance point of G sensor 2). The frequency band used for the collision judgment indispensably requires no existence of resonance/damping in the vibration transmission of the casing. On the other hand, at or above the frequency level where the G sensor starts resonating, it is indispensably required that the acceleration entered in the G sensor 2 is sufficiently attenuated so as not to give adverse influence to the detection of the G sensor 2 at the lower frequency side. Furthermore, as the resonance point of the casing is set to be lower than the resonance point of the G sensor, there is no problem even if the casing resonates in the frequency band closer to the resonance point of the casing.

Figure 5:
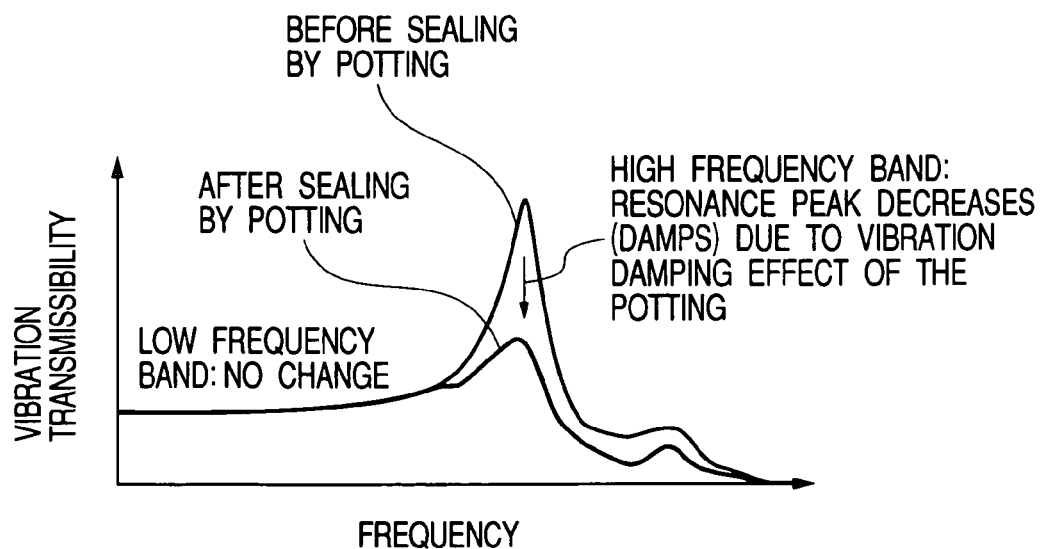
FIG. 5 is a graph showing change in the vibration transfer characteristics of the casing as a difference before and after sealing with the potting material in accordance with the first embodiment of the present invention.
Figure 6A:
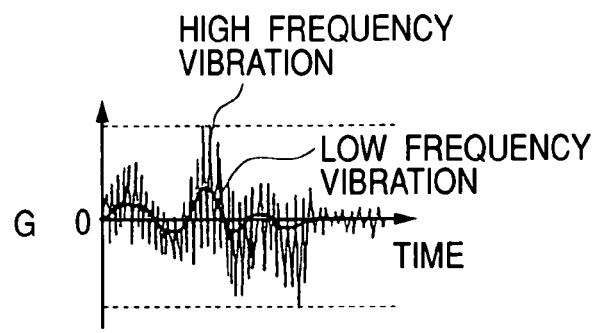
FIG. 6A is a graph showing one example of input waveform of the collision G.
Figure 6B:
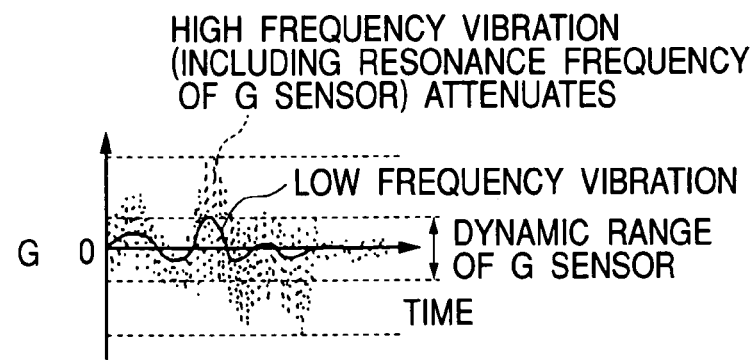
FIG. 6B is a graph showing one example of vibration waveform as an effect of damping high-frequency vibration.
Figure 6C:
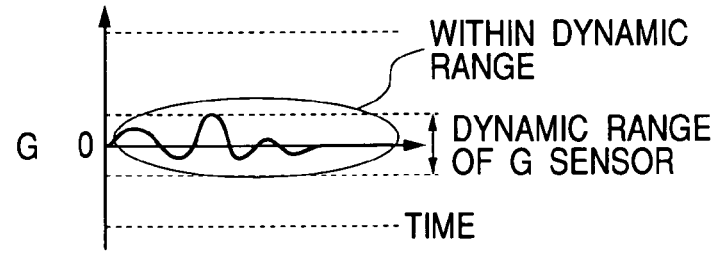
FIG. 6C is a graph showing one example of vibration waveform entered into the G sensor.

Next, the sequential flow starting from input of collision G vibration and ending by sensor signal output will be explained with reference to FIGS. 4 to 6A–6D. As shown in FIG. 6A, the collision G vibration includes low-frequency vibration (indicated by a bold line) and high-frequency vibration (indicated by thin line) added or superimposed thereon. When the sensor device 1 receives the vibration transmitted via the vehicle body, the potting material 5 sealing the G sensor chamber 3a effectively damps the high-frequency vibration including the resonance point of the G sensor 2, as shown in FIG. 5. Thus, as shown in FIG. 6B, the vibration transmitted to the G sensor 2 is substantially limited only to the low-frequency vibration necessary for the collision judgment. As shown in FIG. 6C, the low-frequency vibration transmitted to the G sensor 2 is within the dynamic range. Thus, the G sensor 2 can produce a correct G detection signal.

Accordingly, the airbag control apparatus can accurately judge the collision conditions based on the correct G detection signal and can appropriately control the expansion of the airbag.

Figure 6D:
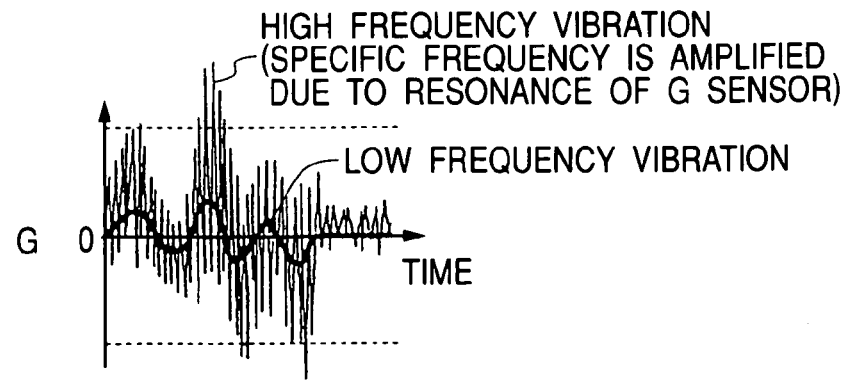
FIG. 6D is a graph showing one example of vibration waveform transmitted to the G sensor in a comparative sensor device in a case that transmission of vibration is improper.

For comparison, FIG. 6D shows inappropriate transmission of vibration caused in a comparative sensor device. As apparent from FIG. 6D, high-frequency vibration causes the G sensor to resonate and accordingly amplifies the vibration of a specific frequency. Hence, the vibration transmitted to the G sensor goes beyond the dynamic range, and accordingly the G sensor cannot produce a correct G detection signal.

This embodiment employs a fixing structure not using a P plate (e.g., a glass epoxy substrate) for fixing the sensor 2 to the casing 3. According to this fixing structure, compared with another fixing structure using the P plate intervening between the G sensor and the casing (i.e., the structure shown in FIGS. 12A–12B and 13), transmission of vibration from the casing to the G sensor becomes rather direct or immediate. In this respect, the above-described potting material 5 sealing or surrounding the G sensor 2 has very important role in damping the high-frequency vibration.

Furthermore, according to this embodiment, the potting material used for surrounding the G sensor 2 brings the effects of maintaining appropriate airtightness and removing the cause of moisture and corrosion.

Second Embodiment

Next, a collision detecting sensor device 51 in accordance with a second embodiment of this invention will be explained with reference to FIGS. 7 to 10. The parts or components identical with those of the first embodiment are denoted with the same reference numerals and will not be explained hereinafter.

According to the above-described first embodiment, the sensor chamber 3a of the casing 3 is sealed with the potting material 5 to realize a damping structure for suppressing or eliminating high-frequency vibration. The second embodiment employs a damping structure using a vibration proofing material 55 configured into a plate or sheet or molded together with the G sensor 2 to fix the G sensor 2 to the casing 3, thereby suppressing or eliminating the high-frequency vibration without using the potting material 5.

Figure 7:
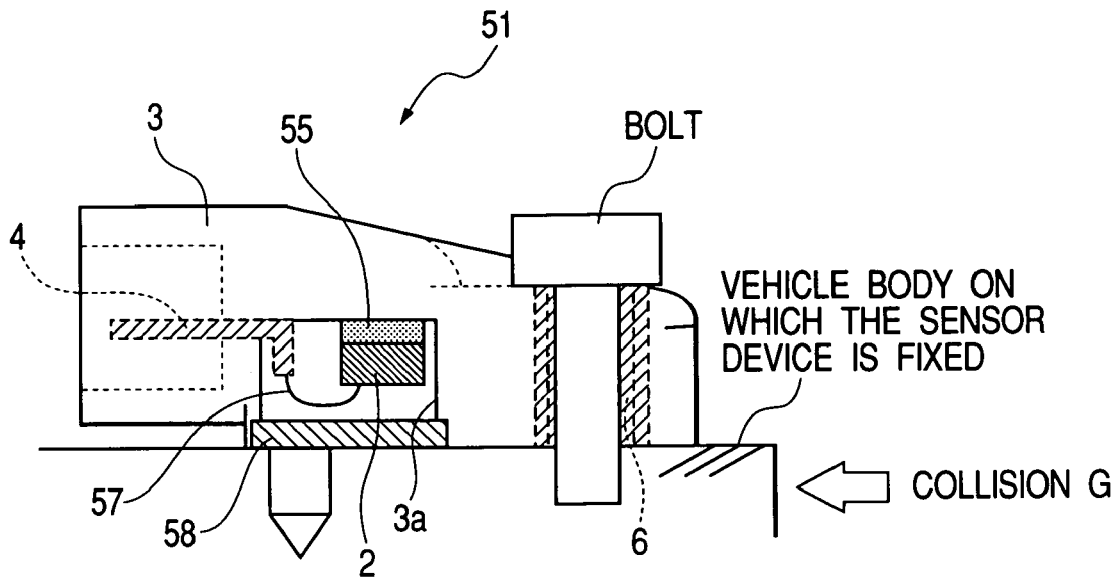
FIG. 7 is a side view showing the schematic arrangement of a collision detecting sensor device in accordance with a second embodiment of the present invention.

Namely, as shown in FIG. 7, the casing 3 has the sensor chamber 3a which opens toward a lower surface side of the casing 3. The plate or sheet vibration proofing material 55 is bonded and fixed at its one surface to an inner wall surface of the sensor chamber 3a. The G sensor 2 is bonded and fixed to the opposite surface (e.g., the lower surface according to the embodiment shown in FIG. 7) of the vibration proofing material 55. (Alternatively, the vibration proofing material 55 molded together with the G sensor 2 is bonded or fixed to the casing 3). The vibration proofing material 55 is an elastic material capable of damping high-frequency vibration and is, for example, is made of a silicone rubber or the like. The connector terminal 4 and the G sensor 2 are connected via a wire bonding 57, to provide electrical connection. Furthermore, the opening of the sensor chamber 3a is closed with a plate lid 58 made of a resin material.

According to this embodiment, the G sensor 2 is fixed to the casing 3 via the vibration proofing material 55. Employing this structure brings the effect of surely damping the high-frequency vibration like the above-described first embodiment (refer to FIGS. 4 to 6A–6D).

Figure 8:
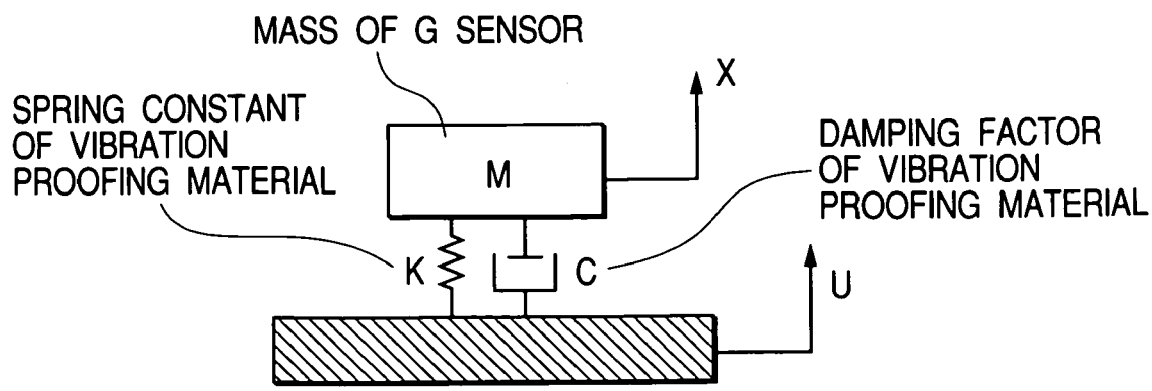
FIG. 8 is a view explaining a model consisting of the G sensor and a vibration proofing material in accordance with the second embodiment of the present invention.
Figure 9A:
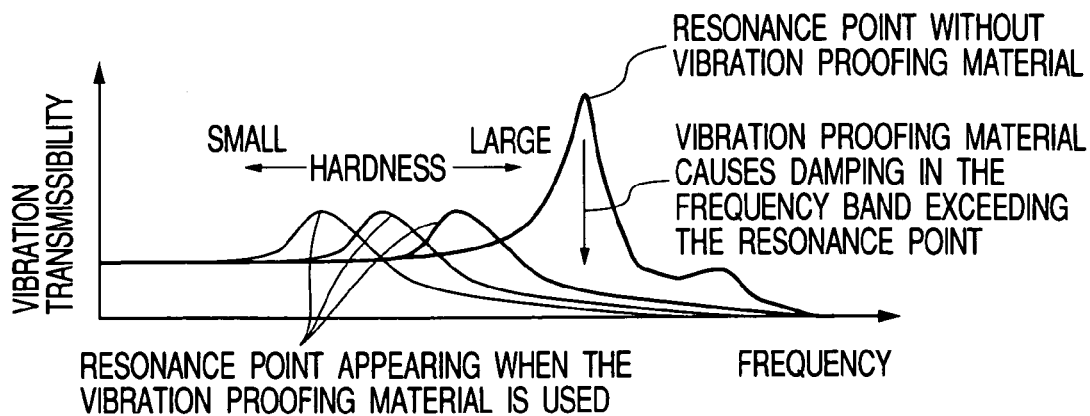
FIG. 9A is a graph showing the resonance point of the casing varying with changing hardness of the vibration proofing material.
Figure 9B:
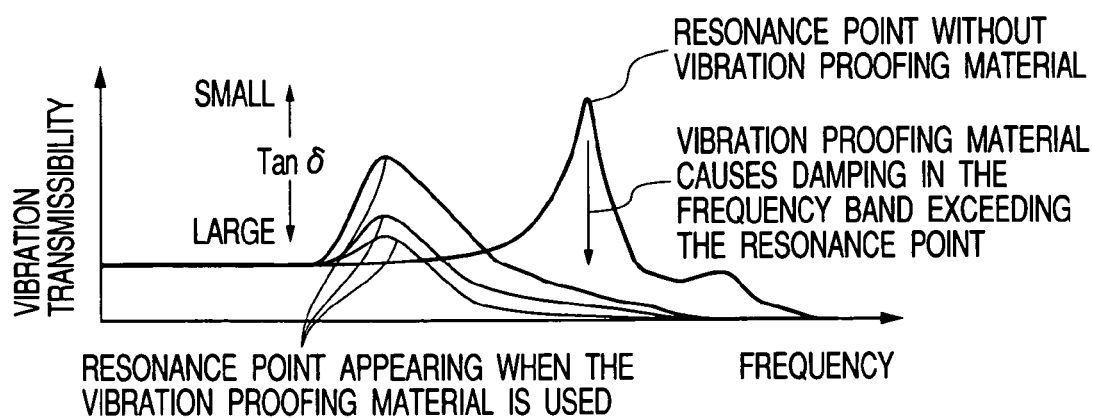
FIG. 9B is a graph showing the resonance peak of the casing varying with changing dielectric dissipation factor of the vibration proofing material.
Figure 9C:
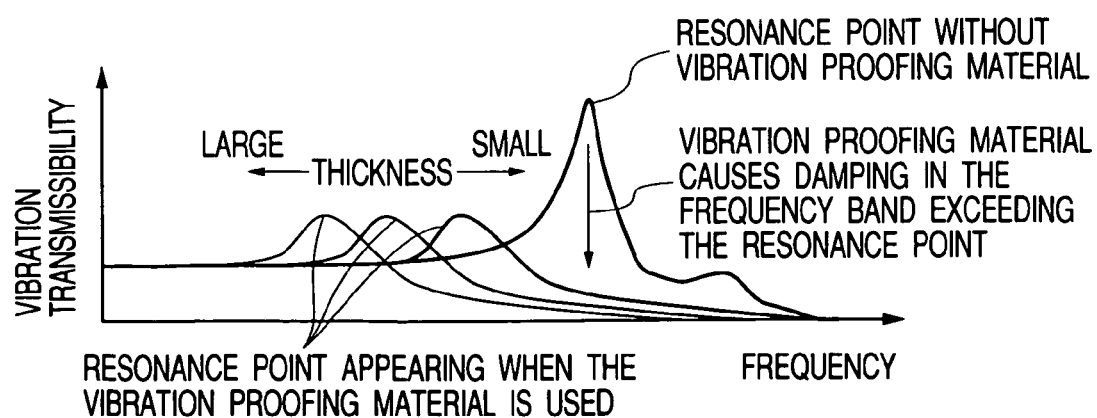
FIG. 9C is a graph showing the resonance point varying with increasing thickness of the vibration proofing material.
Figure 10:
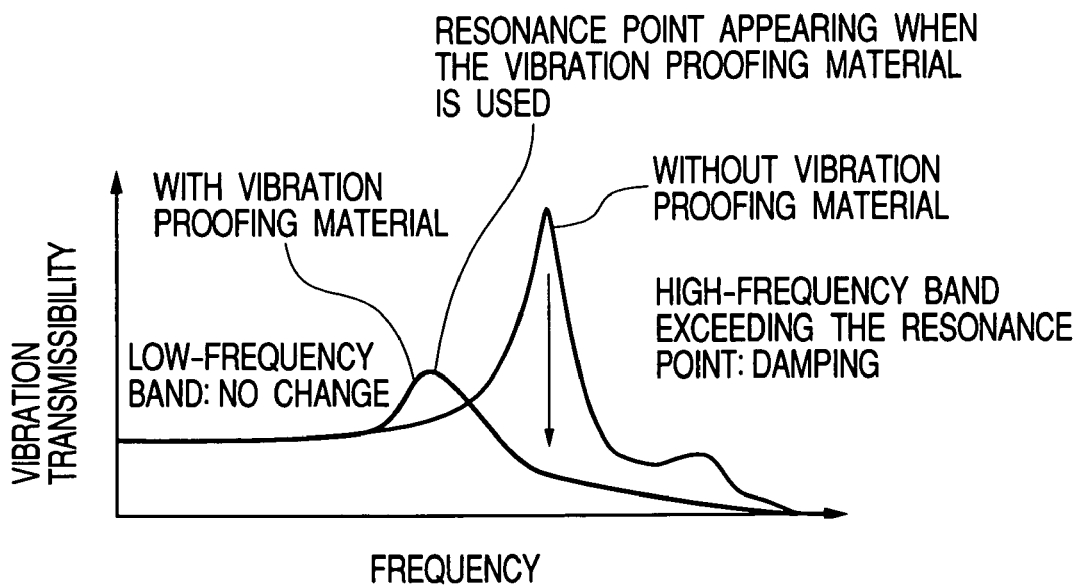
FIG. 10 is a graph showing the vibration transfer characteristics of the casing varying depending on the presence of the vibration proofing material in accordance with the second embodiment of the present invention.

Furthermore, according to this embodiment, as shown in FIG. 8, it is possible to assume a model consisting of a mass M of G sensor, a spring constant K of the vibration proofing material, and a damping factor C of the vibration proofing material. The spring constant and the damping factor of the vibration proofing material can be changed by adequately changing the physical properties of the vibration proofing material 55, including hardness, dielectric dissipation factor (Tan δ) or the like, as well as the size including thickness, or the shape. Through this adjustment, it is possible to set the resonance point (i.e., the resonance frequency) or the resonance peak of the casing to an optimum value within a desired range. For example, as shown in FIG. 9A, by changing the hardness of the vibration proofing material 55, it is possible to shift the resonance point. More specifically, the resonance point becomes higher with increasing hardness of the vibration proofing material 55 (according to FIG. 9A, the resonance point shifts right), and the resonance point becomes lower with decreasing hardness (according to FIG. 9A, the resonance point shifts left). Furthermore, as shown in FIG. 9B, the resonance peak decreases with increasing dielectric dissipation factor (Tan δ) of the vibration proofing material 55. Furthermore, as shown in FIG. 9C, the resonance point shifts when the thickness of the vibration proofing material 55 is changed. Therefore, according to this embodiment, as shown in FIG. 10, it becomes possible to optimize the G transfer characteristics of the casing 3 so as to realize desired characteristics without changing the external size and shape of the casing 3. Namely, the resonance point of the casing 3 including the vibration proofing material 55 can be changed to a frequency lower than the resonance point of the G sensor 2, and the resonance peak can be lowered. Thus, it becomes possible to unify the outer shape of the casing. The cost reduction of the casing is feasible. No mounting design is necessary.

Figure 11:
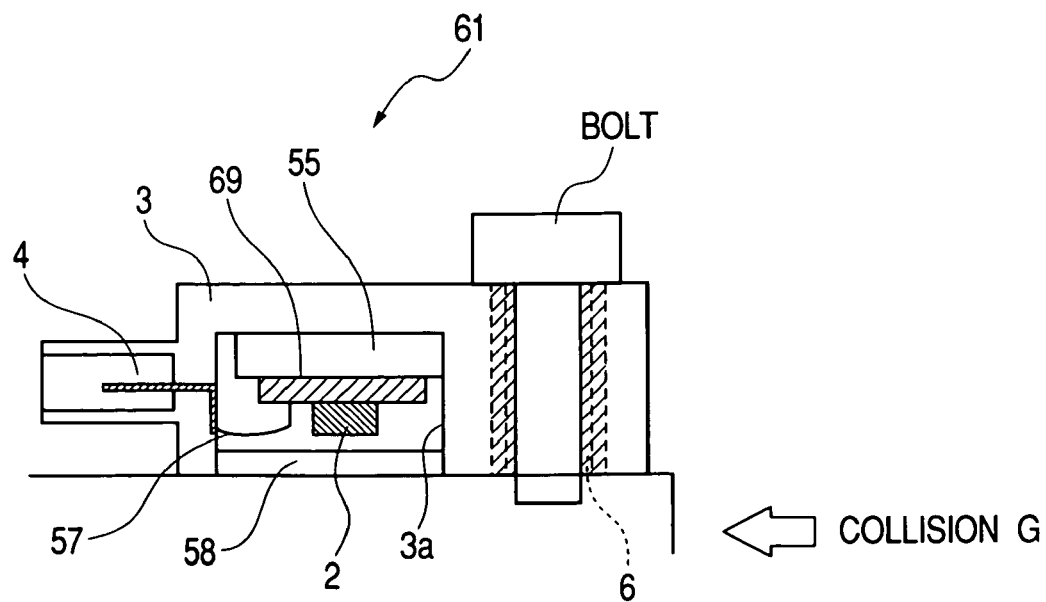
FIG. 11 is a side view showing the schematic arrangement of a modified collision detecting sensor device in accordance with the second embodiment of the present invention.

Next, a modified embodiment of the second embodiment will be explained with reference to FIG. 11. According to the above-described second embodiment, the G sensor 2 includes the detecting portion, the communicating portion, and the electric power source circuit which are integrated as one package. The G sensor 2 is directly bonded and fixed to the vibration proofing material 55. However, a sensor device 61 of this modified embodiment includes the G sensor 2 mounted on a P plate (e.g., a glass epoxy substrate) 69. According to the structure of this sensor device 61, the vibration proofing material 55 is bonded and fixed at its one surface to the inner wall surface of the G sensor chamber 3a of the casing 3. The P plate 69 mounting the G sensor 2 is bonded and fixed to the opposite surface of the vibration proofing material 55. Thus, this modified embodiment brings the effects similar to those of the above-described second embodiment.

Third Embodiment

Next, a collision detecting sensor device 71 according to a third embodiment of this invention will be explained with reference to FIGS. 12A–12B to 14. The parts or components identical with those of the above-described respective embodiments are denoted with the same reference numerals and will not be explained hereinafter.

According to the above-described second embodiment, the G sensor 2 is fixed to the casing 3 via the vibration proofing material 55 configured into a plate or a sheet or molded together with the G sensor 2 to provide a structure capable of damping high-frequency vibration. Instead of using the above-described structure, this embodiment employs a spring-mass system capable of damping high-frequency vibration. As shown in FIGS. 12A–12B, the spring-mass system includes a plurality of elastic leads 75 each having one end connected to the G sensor 2 and the other end fixed to the casing 3. The elasticity of these leads 75 and the mass of G sensor 2 cooperatively constitute the spring-mass system. Each lead 75 serves as the lead member of this invention.

Figure 12B:
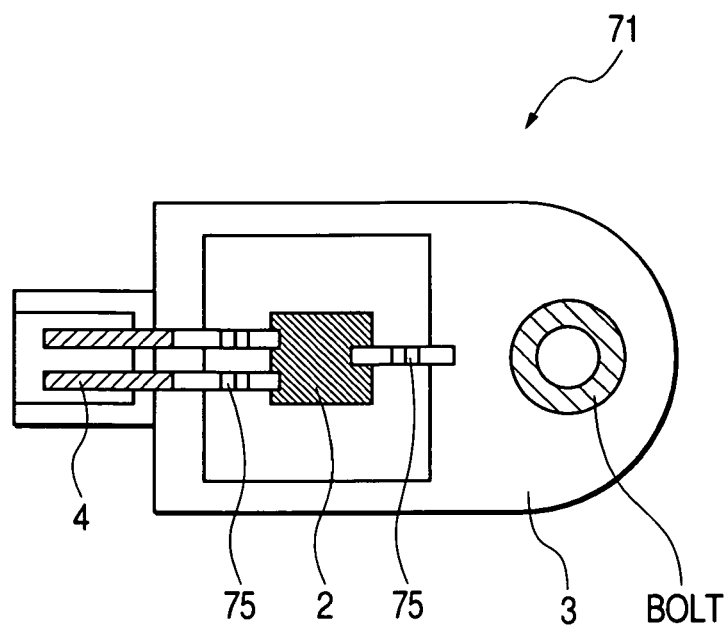
FIG. 12B is a cross-sectional view of the sensor device in accordance with the third embodiment of the present invention, taken along a line A—A of FIG. 12A.
Figure 12A:
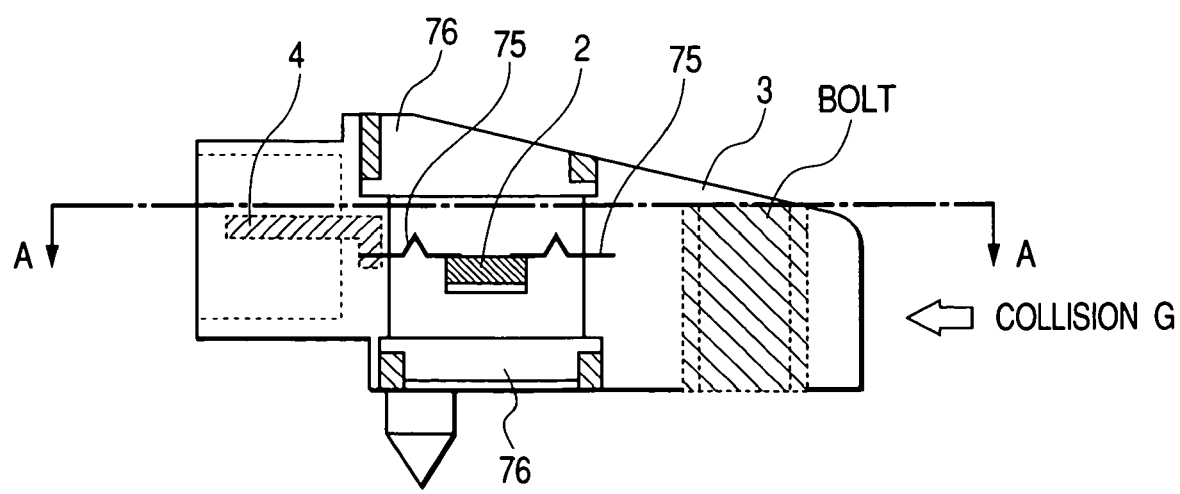
FIG. 12A is a side view showing the schematic arrangement of a collision detecting sensor device in accordance with a third embodiment of the present invention.

More specifically, as shown in FIGS. 12A–12B, in the collision detecting sensor device 71, the G sensor 2 is connected to the casing 3 via two leads 75 provided at its rear side (i.e., the left of G sensor 2 shown in FIGS. 12A–12B) and one lead 75 provided at its front side (i.e., the right of G sensor 2 shown in FIGS. 12A–12B). Each lead 75 is an elastic member which is made of a metallic material and has a bent portion formed at substantially the center in the longitudinal direction. Each lead 75 has one end bonded to the G sensor 2 by brazing or soldering. Furthermore, each lead 75 has the other end being integrated with the casing 3 by molding (insert molding). Thus, the leads 75 are respectively fixed to the casing 3. Furthermore, the other end of each rear lead 75 is welded to the connector terminal 4 to provide electrical connection. Accordingly, positioning the G sensor 2 in molding dies is feasible. Extremely accurate positioning is realized. Furthermore, the casing 3 has upper and lower openings which are respectively closed by lids 76 to maintain appropriate airtightness for the connector terminal 4, the leads 75, and the G sensor 2 which are insert molded in the casing 3. Each lid 76 is fixed to the casing 3 by seal, laser welding, or the like.

Figure 13:
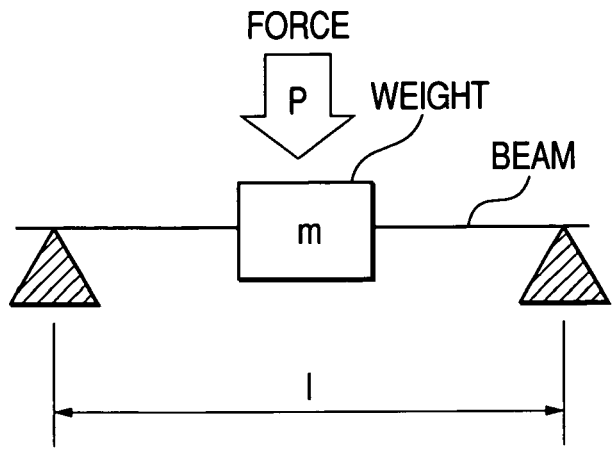
FIG. 13 is a view showing a model of a spring-mass system consisting of leads and the G sensor in accordance with the third embodiment of the present invention.

The leads 75 and the G sensor 2 cooperatively constitute spring-mass system shown in FIG. 13 which has a characteristic frequency. Namely, the leads 75 have the role of spring and the G sensor 2 has the role of mass in the spring-mass system. The characteristic frequency fn of this spring-mass system can be defined with the following equation 5 which is derived from the following equations 1 to 4. In the equation 5, '1' represents the length of a beam simply supported at its both ends, 'm' represents the mass of a weight provided at the center of the beam, and EI represents a bending rigidity of the beam (E: elastic module, I: geometrical moment of inertia).

More specifically, the following equation 1 shows a deflection δ at the midpoint of the beam.

$$\delta = \frac{Pl^3}{48EI} \quad (1)$$

The equation 1 can be modified in the following equation 2 to obtain the spring constant k of the beam.

$$k = \frac{P}{\delta} = \frac{48EI}{l^3} \quad (2)$$

Furthermore, when 'x' represents a bending displacement at the center of the beam, the following equation 3 is established.

$$m\ddot{x} + kx = 0 \quad (3)$$

Accordingly, the following equation 4 is obtained by entering the equation 2 into the equation 3.

$$\ddot{x} + \frac{48EI}{ml^3} x = 0 \quad (4)$$

Therefore, the characteristic frequency fn can be expressed with the following equation 5.

$$fn = \frac{\omega n}{2\pi} = \frac{1}{2\pi} \sqrt{\frac{48EI}{ml^3}} \quad (5)$$

As the characteristic frequency fn of the spring-mass system can be expressed with the above-described equation 5, it is understood that the characteristic frequency fn can be controlled by changing the bending rigidity EI or by changing the mass 'M' of the G sensor 2. Regarding the method for decreasing the bending rigidity EI, it will be effective: to use a material having a smaller elastic module for respective leads 75; to reduce the geometrical moment of inertia of respective leads 75 (e.g, changing the cross-sectional shape); and to provide an adequate bent portion to respective leads 75.

Figure 14:
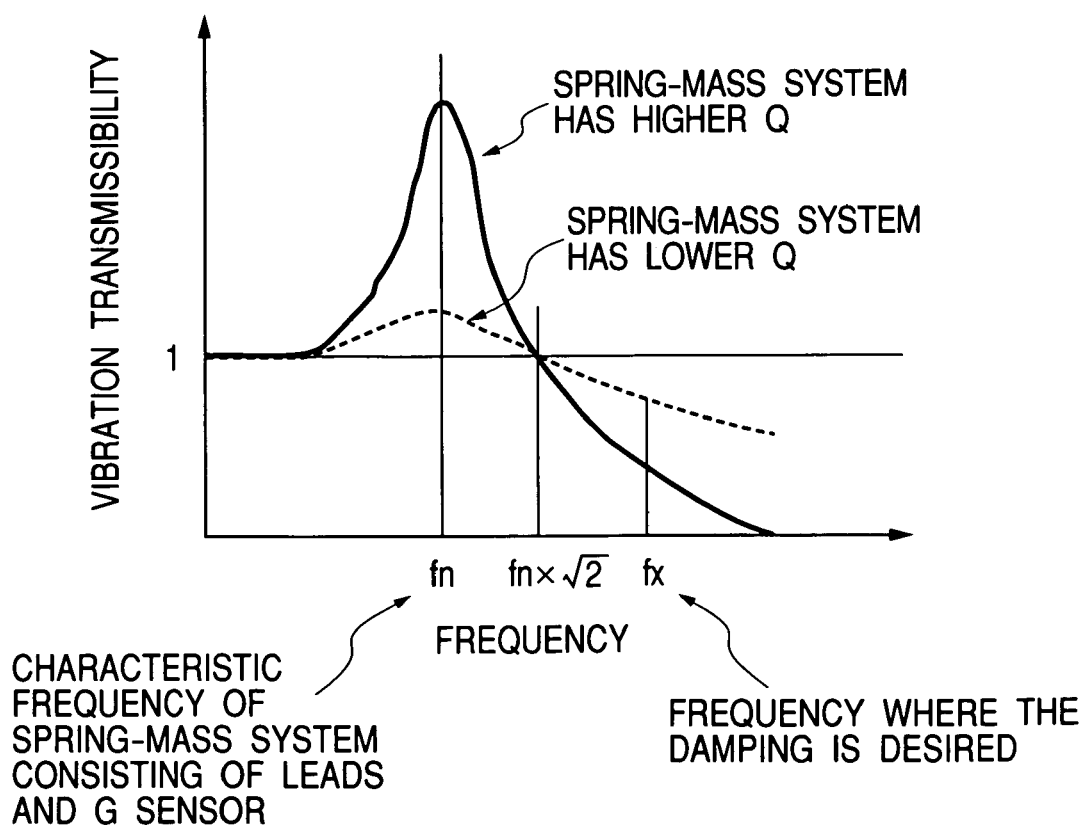
FIG. 14 is a graph showing one example of vibration transfer characteristics of the spring-mass system consisting of leads and the G sensor in accordance with the third embodiment of the present invention.

FIG. 14 shows the vibration transfer characteristics of the spring-mass system consisting of the leads 75 and the G sensor 2. When the spring-mass system has the characteristic frequency fn, the vibration transmissibility always becomes 1 at the frequency $fn \times \sqrt{2}$. The damping begins when the frequency exceeds $fn \times \sqrt{2}$. Accordingly, assuming that the vibration damping is required at the frequency fx, it is only necessary to adjust the characteristic frequency fn of the spring-mass system to satisfy the relationship (the vibration transmissibility becomes less than 1 at the frequency fx) shown in the graph of FIG. 14.

Figure 15B:
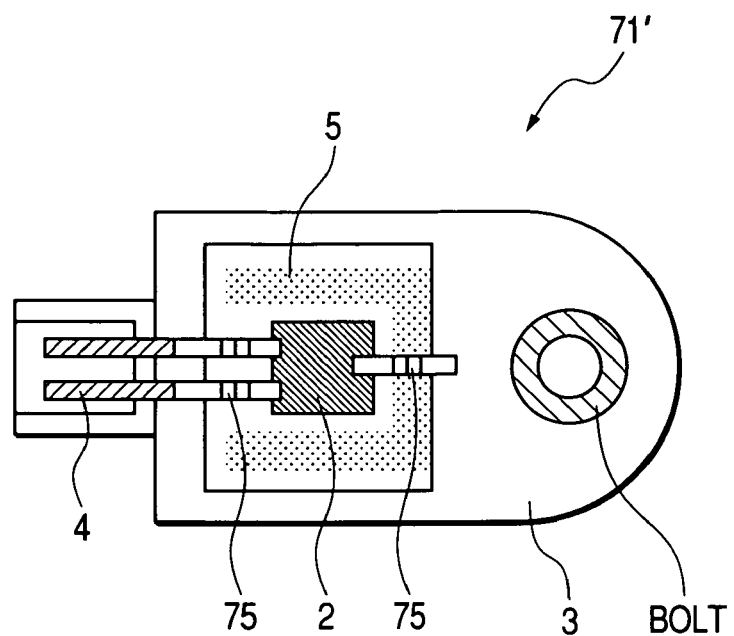
FIG. 15B is a cross-sectional view of this sensor device taken along a line B—B of FIG. 15A.
Figure 15A:
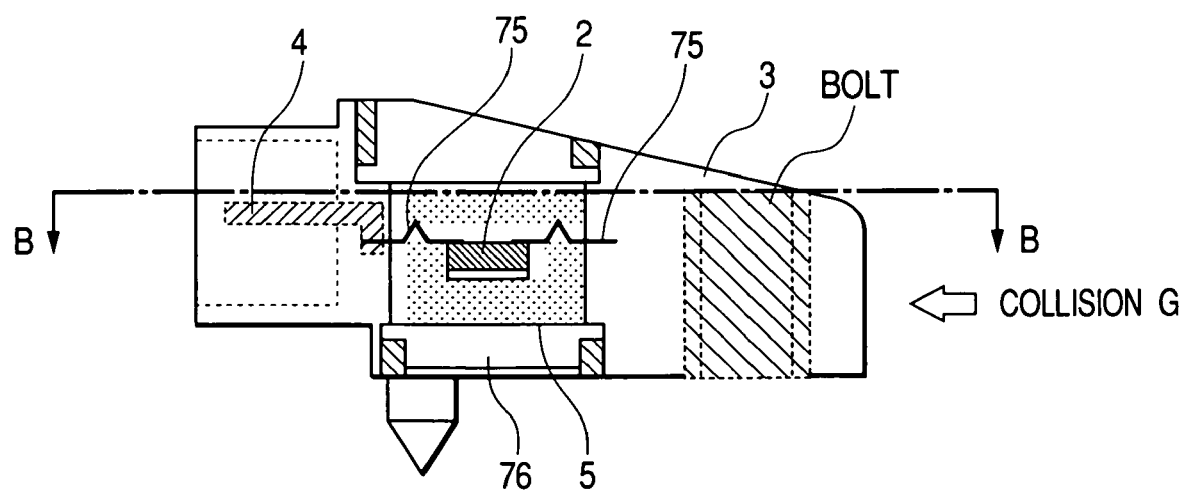
FIG. 15A is a side view showing the schematic arrangement of a modified collision detecting sensor device in accordance with the third embodiment of the present invention.

Furthermore, it is possible to change the vibration damping amount by changing the Q value of the vibration in the spring-mass system. In the graph shown in FIG. 14, a solid line shows a case that the Q value of the spring-mass system is relatively high and a dotted line shows a case that the Q value of the spring-mass system is relatively low. For example, FIGS. 15A and 15B show a modified collision detecting sensor device 71' in accordance with the third embodiment. According to this modified sensor device 71', the potting material 5 fills the inside space of the casing 3 where the G sensor 2 is housed so as to change the Q value. FIG. 15A is a schematic view showing the arrangement of the collision detecting sensor device 71' seen from the side. FIG. 15B is a cross-sectional view of the sensor device 71' taken along a line B—B in FIG. 15A.

This invention is not limited to the above-described first to third embodiments and accordingly can be variously modified without departing from the gist of the present invention.

For example, the structure for damping high-frequency vibration is not limited to the structure disclosed in each of the first to third embodiments. In short, the damping structure of the invention should include a vibration damping member interposing between at least part of the G sensor and the casing for damping the high-frequency vibration.

Furthermore, according to each of the above-described first to third embodiments of this invention, the collision detecting sensor device is used for detecting the acceleration or vibration. However, the sensor device of this embodiment can be applied, for example, to a rollover sensor for detecting angular acceleration, a roll rate sensor, a yaw rate sensor, or the like. In short, this invention is applicable to a sensor device including an electronic sensor outputting an electric signal in accordance with physical displacement of a sensing portion and a casing mounting this electronic sensor.

Furthermore, according to the above-described modified embodiment of the second embodiment, the G sensor 2 is mounted on the P plate (e.g., glass epoxy substrate) 69. It is however possible to mount the G sensor 2 on a ceramic substrate.

As described above, according to the sensor device of this embodiment, the electronic sensor produces an electric signal in accordance with the physical displacement of the sensing portion. The vibration damping member, intervening between at least part of the electronic sensor and the casing, is capable of surely damping the high-frequency vibration which generally causes resonance. Thus, the sensor device can accurately detect collision, vibration, angular acceleration, or the like without being adversely influenced by the resonance.

Comparative Arrangement (II)

Figure 26:
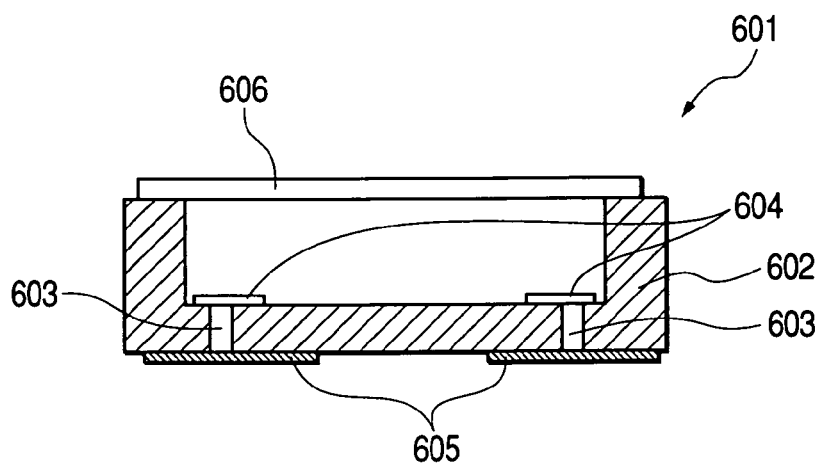
FIG. 26 is a side view showing the arrangement of a comparative ceramic package.
Figure 27:
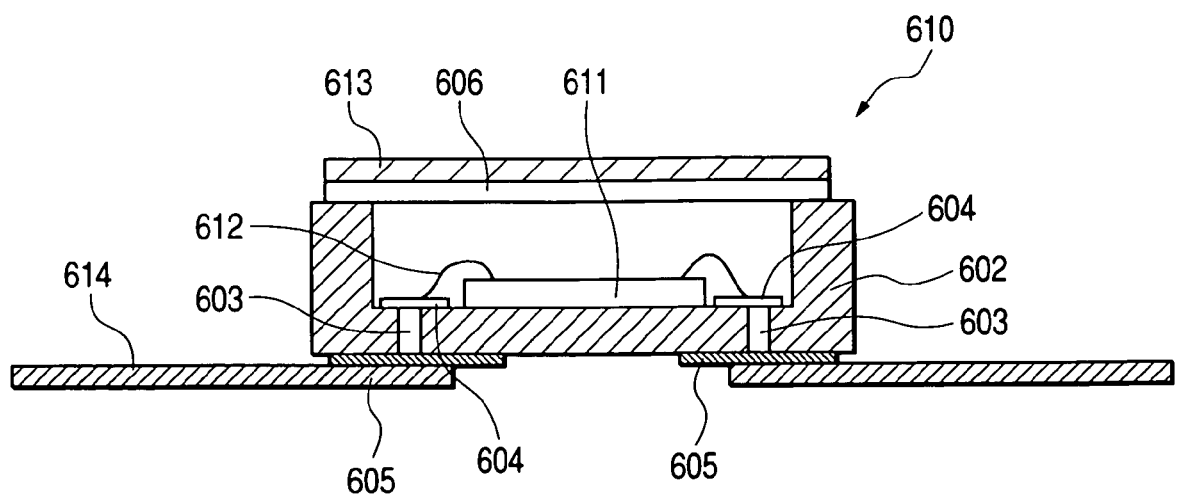
FIG. 27 is a side view showing, as an example, the arrangement of a circuit device employing the comparative ceramic package.

In general, an automotive vehicle is equipped with electronic devices for various controls, among which a G sensor or other electronic components are usually housed in a package made of a ceramic member or the like. For example, FIG. 26 shows a comparative electronic component mounting ceramic package (hereinafter, referred to as ceramic package) 601 which includes a ceramic package main body (hereinafter, referred to as main body) 602, vias 603, internal circuits 604, metallic electrodes 605, and a metallic ring 606. The main body 602 is a box-shaped member with an open upper surface and made of a ceramic material (e.g., alumina). Each via 603, made of a metallic material, serves as a member for providing electrical connection between the inside (i.e., bottom surface side) and the outside (i.e., lower surface side) of the box-shaped main body 602. Each internal circuit 604 is printed on an internal surface of the main body 602 including an exposed portion of a corresponding via 603. Each metallic electrode 605 is formed on a lower side surface of the main body 602 including an exposed portion of a corresponding via 603 by printing or surface treatment. The metallic ring 606 is a frame member having an aperture corresponding to the upper opening of the main body 602 and is fixed on the upper surface portion of the main body 602 by brazing. According to the circuit device 610 having the arrangement using the above-described ceramic package 601, for example, as shown in FIG. 27, a circuit chip 611 is bonded on a bottom surface of the main body 602 with an adhesive material. The circuit chip 611 is connected to each internal circuit 604 with a wire bonding 612. A flat metallic lid 613 is welded on the metallic ring 606 extending along the opening of the main body 602. As a result, the circuit chip 611 is airtightly accommodated in the box-shaped main body 602. Meanwhile, each lead 614 is connected to the metallic electrode 605 by brazing or by soldering for providing electrical connection between the metallic electrode 605 and other member (e.g., P plate, connector terminal, etc).

However, according to the above-described conventional electronic component mounting ceramic package 601, the brazing operation for bonding each lead 614 to the metallic electrode 605 needs to be performed at a higher temperature (e.g., 500 to 800° C.). Thus, it is necessary to accomplish the bonding of lead 614 before the circuit chip 611 is mounted on the ceramic package main body 602 with the adhesive material possessing heat resistive temperature of approximately 300° C. This will greatly reduce the number of manufactured units for the ceramic package, and accordingly the cost will increase. Furthermore, mounting the circuit chip 611 on the ceramic package 601 with already bonded leads 614 will require an assembling facility mounting the circuit chip 611 to be flexibly adaptable to various kinds of leads. In other words, this kind of facility needs to be made according to a special order, and accordingly construction cost will be expensive. Assembling man-hours will also increase. The manufacturing cost will increase, accordingly. On the other hand, in the case that the soldering operation is used to bond the leads 614, if the circuit device 610 is entirely resin molded, there will be the possibility that resin molding pressure or resin molding heat may act to damage a bonding portion of the soldered lead 614 and the metallic electrode 605. The reliability in the bonding strength will be lowered. More specifically, the resin molding temperature is in the level of 260° C., whereas the solder melting temperature is in a lower temperature range of 220° C. to 250° C. Thus, the solder forming the bonding portion is fused with the resin molding heat and is further subjected to the resin molding pressure.

Fourth Embodiment

Hereinafter, an electronic component mounting ceramic package in accordance with a preferred embodiment of this invention will be explained with reference to attached drawings.

Figure 21A:
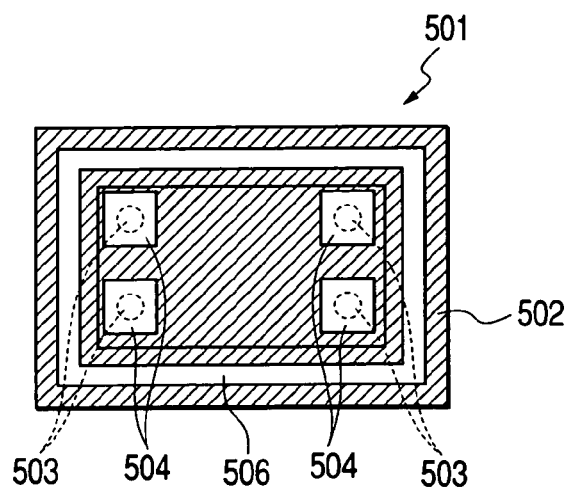
FIG. 21A is a plan view showing the arrangement of an electronic component mounting ceramic package in accordance with a fourth embodiment of the present invention.
Figure 21B:
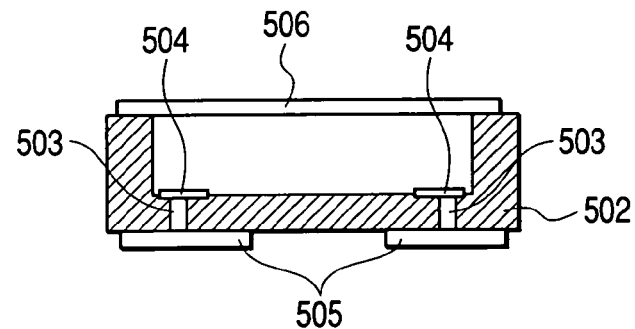
FIG. 21B is a side view showing the ceramic package in accordance with the fourth embodiment of the present invention.
Figure 21C:
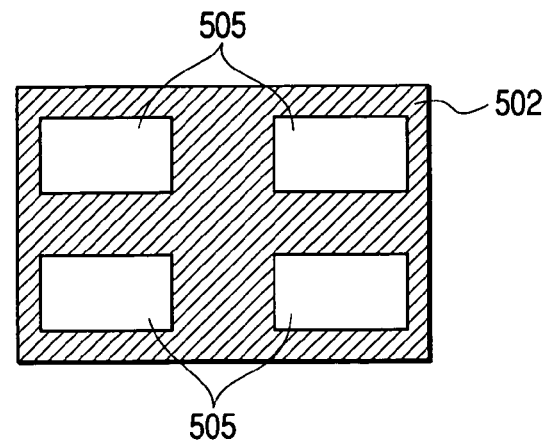
FIG. 21C is a bottom view showing the ceramic package in accordance with the fourth embodiment of the present invention.
Figure 21D:
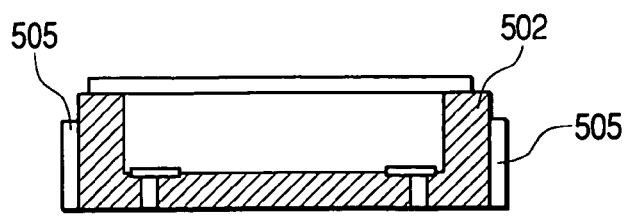
FIG. 21D is a side view showing modified positioning of a metallic electrode in accordance with the fourth embodiment of the present invention.

The electronic component mounting ceramic package (hereinafter, referred to as "ceramic package") 501 of this embodiment, as shown in FIGS. 21A–21D, includes a ceramic package main body (hereinafter, referred to as "main body") 502, vias 503, internal circuits 504, metallic electrodes 505, and a metallic ring 506. FIG. 21A is a plan view, FIG. 21B is a side view, and FIG. 21C is a bottom view, respectively showing the ceramic package. FIG. 21D is a side view showing modified positioning of the metallic electrode.

The main body 502 is a box-shaped member with an open upper surface and made of a ceramic material (e.g., alumina). The main body 502 has a space for mounting a circuit chip or other electronic components. The main body 502 is, for example, formed by printing wiring patterns on a plurality of ceramic sheets to form a multilayered structure of these ceramic sheets and then sintering this integrated body.

Each via 503, made of a metallic material, serves as a member for providing electrical connection between the inside (i.e., bottom surface side) and the outside (i.e., lower surface side) of the box-shaped main body 502. Each via 503 is driven into the main body 502 (i.e., into the ceramic sheets) beforehand and is sintered together with the main body 502.

Each internal circuit 504 is formed by printing on an internal (i.e., upper surface side) surface of the box-shaped main body 502 including an exposed portion of a corresponding via 503.

Each metallic electrode 505 is formed by brazing a metallic material on a bottom (i.e., lower surface side) surface of the main body 502 including an exposed portion of a corresponding via 3. The metallic material of the metallic electrode 505 is, for example, a metallic material chiefly containing iron, nickel, and cobalt (referred to as "kovar") or a metallic material chiefly containing iron and nickel. Surface treatment, such as nickel plating, or gold plating, is applied on the surface of each metallic electrode 505. Furthermore, the brazing for respective metallic electrodes 505 is carried out at the temperature range of 500° C. to 800° C. with silver solder or the like. Although this embodiment shows a total of four vias 503 and the same number of metallic electrodes, the total number of these elements can be arbitrarily changed if necessary.

On the other hand, FIG. 21D shows modified positioning of the metallic electrodes 505, according to which each metallic electrode 505 is formed by brazing the metallic material on the side surface of the main body 502.

The metallic ring 506 is a frame member made of a metallic material and having an aperture corresponding to the upper opening of the main body 502. The metallic ring 506 is fixed on the upper surface portion of the main body 502 by brazing. The metallic ring 506 serves as a platform onto which a metallic lid 513 (later described) is welded so as to cover the opening of the main body 502. The metallic ring 506 and the above-described vias 503 are made of a metallic material identical with that of the metallic electrodes 505 or a metallic material having substantially the same thermal expansion coefficient. Brazing of the metallic electrodes 505 and brazing of the metallic ring 506 can be carried out in the same step. The manufacturing cost can be suppressed.

Figure 22A:
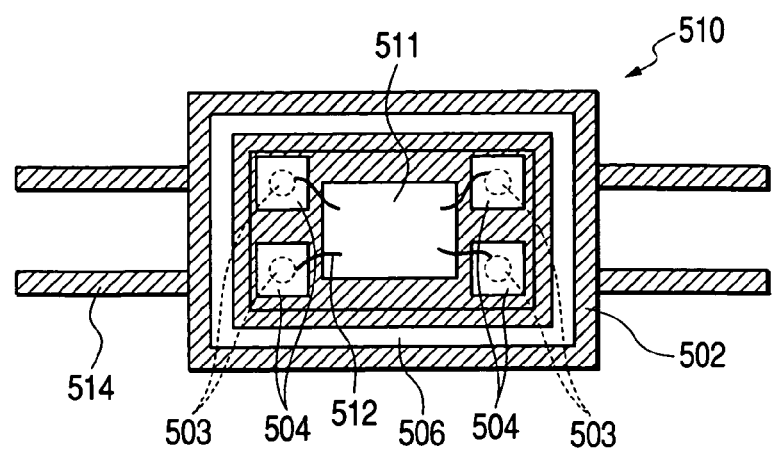
FIG. 22A is a plan view showing the arrangement of a circuit device employing the ceramic package in accordance with the fourth embodiment of the present invention.
Figure 22B:
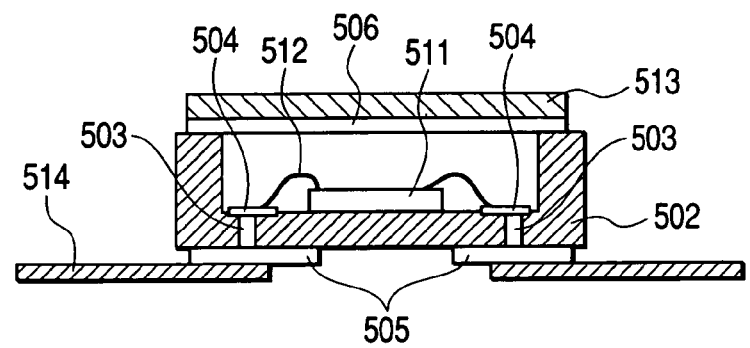
FIG. 22B is a side view showing the circuit device in accordance with the fourth embodiment of the present invention.
Figure 22C:
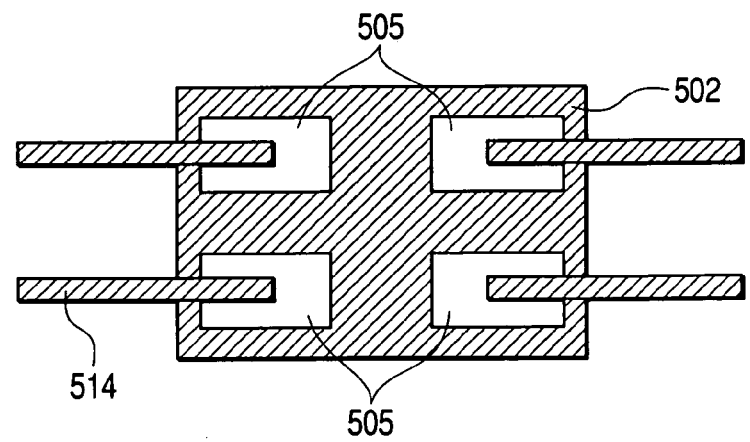
FIG. 22C is a bottom view showing the circuit device in accordance with the fourth embodiment of the present invention.
Figure 22D:
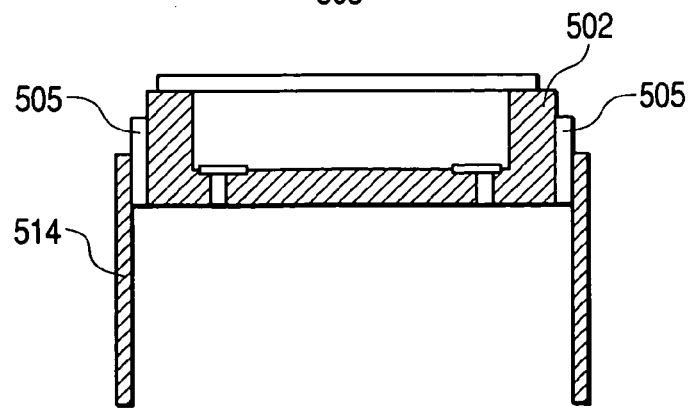
FIG. 22D is a side view showing modified positioning of a metallic electrode in accordance with the fourth embodiment of the present invention.

Next, the arrangement and manufacturing method of a circuit device 510 including the above-described ceramic package 501 mounting a circuit chip or the like will be explained with reference to FIGS. 22A–22D. FIG. 22A is a plan view showing the circuit device 510, FIG. 22B is a side view, and FIG. 22C is a bottom view. FIG. 22D is a side view showing modified positioning of the metallic electrode.

First, a circuit chip 511 is mounted on the ceramic package 501 shown in FIGS. 21A–21D. More specifically, the circuit chip 511 is bonded to the bottom surface of the main body 502 with an adhesive material (heat resistive temperature of approximately 300° C.). Next, the circuit chip 511 is connected to each internal circuit 504 with a wire bonding 512. In this case, as respective leads 514 are not yet bonded to the ceramic package 501, no projection is present on the external surface of the ceramic package 501. Thus, handling of the ceramic package 501 is extremely easy in the circuit chip mounting apparatus. Thus, it becomes possible to use one mounting apparatus for mounting various kinds of circuit chips.

Next, a flat metallic lid 513 configured into a rectangular shape when seen from above is welded onto the metallic ring 506 provided on the upper surface of the main body 502, thereby covering the upper opening of the main body 502. Thus, the circuit chip 511 is airtightly accommodated in the box-shaped main body 502.

Figure 23:
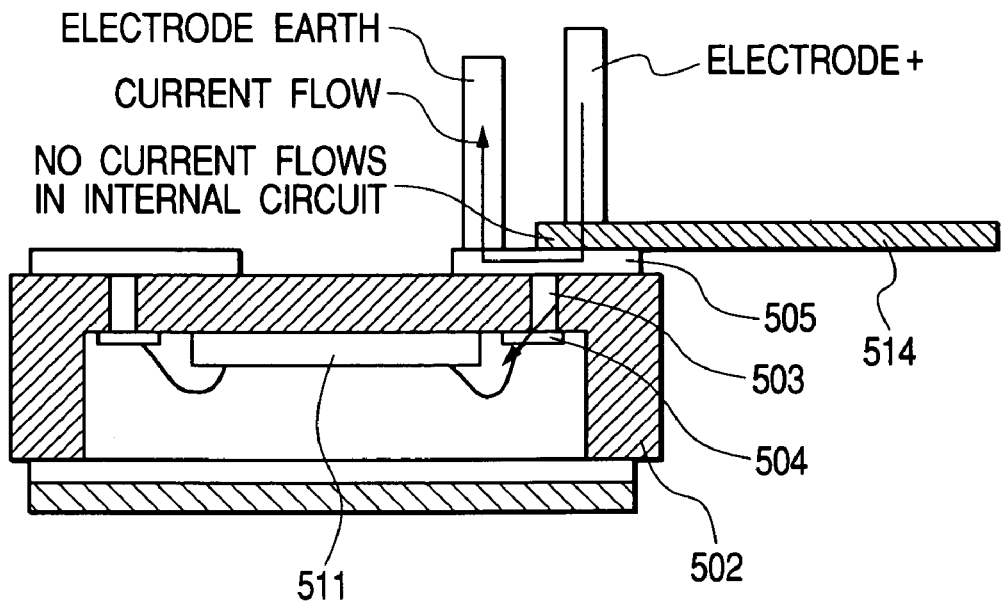
FIG. 23 is a view explaining a step of bonding a lead to the metallic electrode by resistance welding in accordance with the fourth embodiment of the present invention.

Next, each lead 514 providing electric connection between each metallic electrode 505 and other member (e.g., glass epoxy substrate, connector terminal, or the like) is bonded to the metallic electrode 505 by resistance welding. More specifically, as shown in FIG. 23, a welding electrode earth is provided at a predetermined portion of each metallic electrode 505. The lead 514 is brought into contact with the metallic electrode 505 under a mechanical pressure applied thereon. Then, current is supplied from a plus electrode to generate heat required in the resistance welding for bonding the lead 514 to the metallic electrode 505. The resistance welding is carried out at a total of four places where the lead 504 and the metallic electrode 505 are respectively provided as a pair. In this case, the earth terminal provided on the metallic electrode 505 prevents the current from flowing into the circuit chip 511 though the via 503. Thus, the internal circuit in the circuit chip 511 is surely prevented from being damaged by welding current and voltage.

As apparent from the foregoing description, according to this embodiment, the ceramic package main body 502 is provided with the metallic electrode 505 allowing post-welding. Accordingly, even after the circuit chip 511 or other electronic components are mounted on the ceramic package 501, the lead 514 can be firmly bonded by welding to the metallic electrode 505 for the connection to other member (e.g., glass epoxy substrate, connector terminal, or the like)

Furthermore, according to this embodiment, the metallic electrode 505 is bonded to the ceramic package main body 502 by brazing. Thus, the strength is excellent. A lead or the like can be later welded to the metallic electrode 505.

Next, preferable examples of a G sensor device will be explained. Each G sensor device includes the circuit device 510 incorporating a G sensor mounted on the ceramic package 501, and the circuit device 510 is assembled into a casing.

Figure 24:
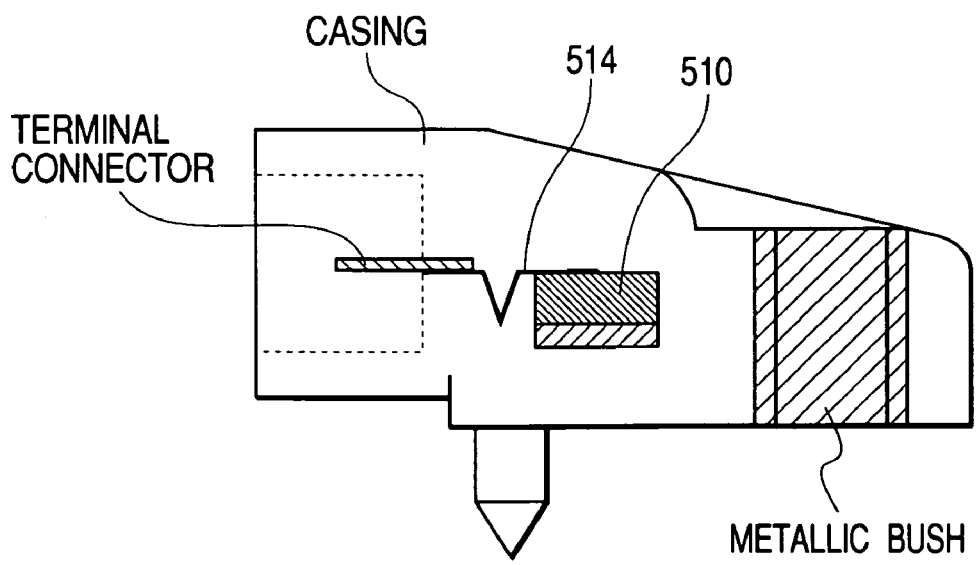
FIG. 24 is a side view showing the schematic arrangement of a G sensor device in accordance with one example of the fourth embodiment of the present invention.

FIG. 24 shows one example of the G sensor device, according to which the lead 514 welded to the metallic electrode 505 of the ceramic package 501 is connected to the connector terminal, and the circuit device 510 mounting the G sensor is entirely molded together with a resin material. As each metallic electrode 505 is firmly bonded to the main body 502 by brazing, the bonding portion of the metallic electrode 505 and the main body 502 is not damaged even when it is subjected to the resin molding pressure or resin molding heat. Accordingly, resin molding of the circuit device 510 is feasible. Depending on the type of the connector terminal, it is possible to integrate the lead 514 and the connector terminal.

Figure 25A:
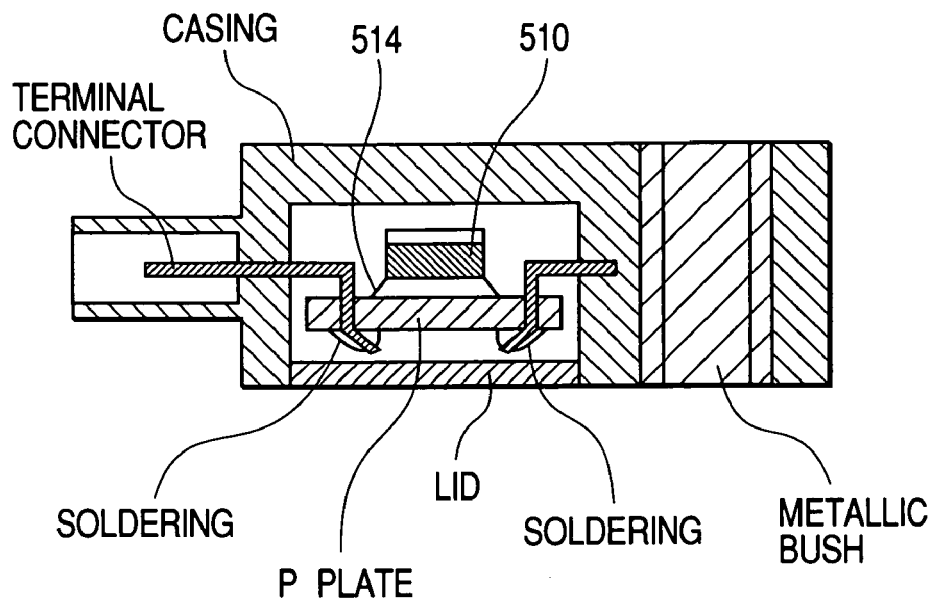
Figure 25B:
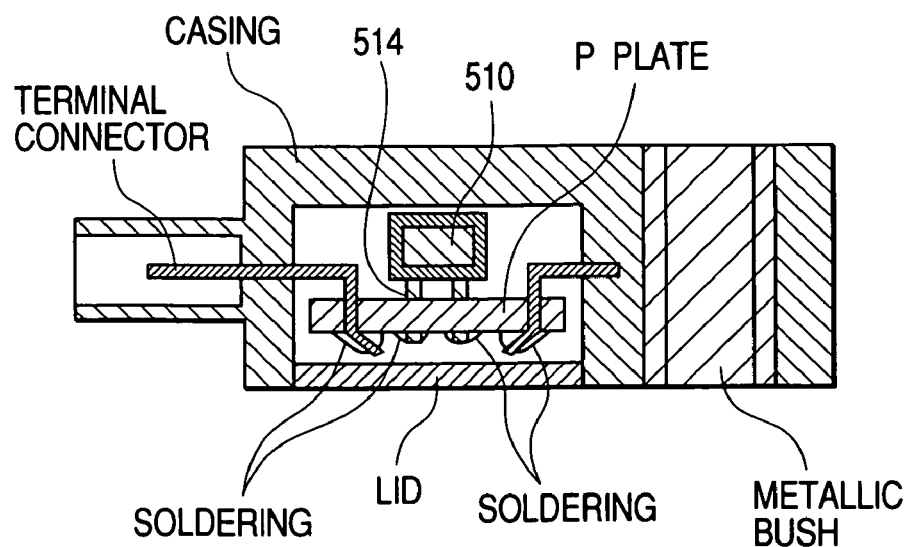

FIGS. 25A and 25B show another example of the G sensor device, according to which the lead 514 welded to the metallic electrode 505 of the ceramic package 501 is used as a mounting frame for a P plate (e.g., glass epoxy substrate). The lead 514 is mounted on the P plate by flow or reflow solder. Furthermore, the P plate mounting the circuit device 510 incorporating the G sensor is housed in an inside space of the casing and is fixed to the casing by clinch of the terminal connector and soldering. FIG. 25A is a horizontal mounting for the circuit device 510, according to which the circuit device 510 is, mounted horizontally with the P plate. FIG. 25B is a vertical mounting of the circuit device, according to which the shape of lead 514 is modified and the circuit device 510 is vertically mounted with respect to the P plate.

The present invention is not limited to the above-described fourth embodiment and accordingly can be variously modified without departing from the gist of this invention.

For example, the metallic material for metallic electrode 505 and the brazing material for the metallic electrode 505 are not limited to the above-described ones and accordingly adequately selected from conventionally known materials depending on the purpose and application.

Furthermore, although the above-described fourth embodiment is based on the G sensor device, this invention is not limited to this embodiment and accordingly it is needless to say that that this invention is widely applicable to many electronic devices using the ceramic package.

As described above, according to the electronic component mounting ceramic package of this invention, the main body of the ceramic package is provided with the metallic electrode allowing post-welding. Accordingly, even after a circuit chip or other electronic components are mounted on the ceramic package, a lead can be firmly bonded by welding to the metallic electrode for the connection to other member (e.g., glass epoxy substrate, connector terminal, or the like)

Fifth Embodiment

Hereinafter, another preferred embodiment of a collision detecting sensor device embodying the sensor device of the present invention will be explained with reference to the attached drawings.

Figure 28:
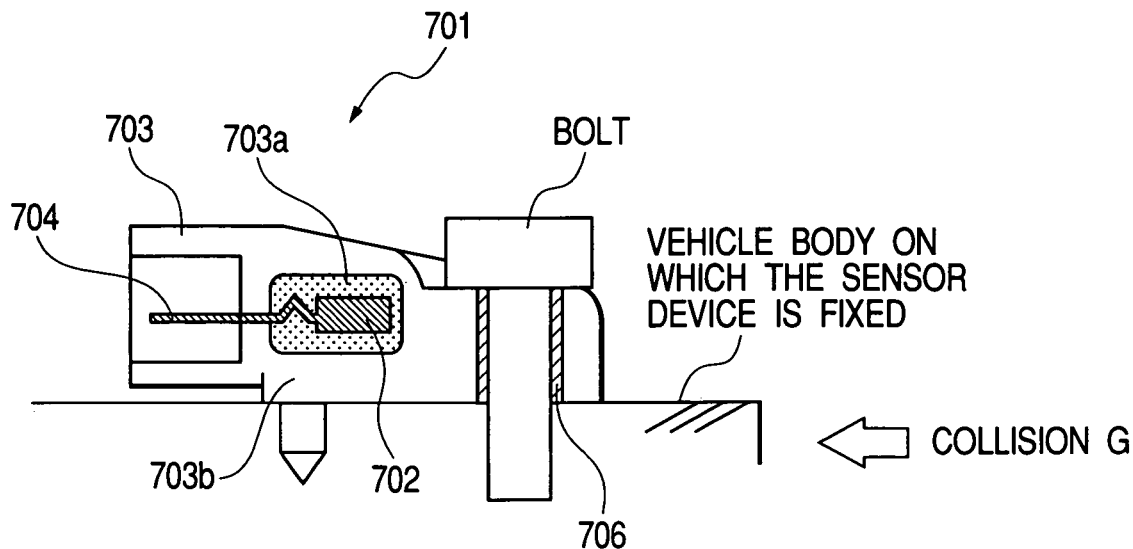
FIG. 28 is a side view showing the schematic arrangement of a collision detecting sensor device in accordance with a fifth embodiment of the present invention.

A collision detecting sensor device (hereinafter, referred to as sensor device) 701 in accordance with a fifth embodiment of the present invention will be explained with reference to FIG. 28. The sensor device 701 is chiefly composed of a G sensor 702 and a casing 703, and is mounted at the front part of a vehicle body or the like to detect collision and output a collision detecting signal to an airbag control apparatus.

Although not shown, the G sensor 702 includes a sensing portion (i.e., a detecting portion) and is arranged to produce an electric signal representing a physical displacement (shift, deformation, etc) of the sensing portion when an acceleration (hereinafter, simply referred to as "G") is entered. Although it is desirable that the G sensor 702 can detect the entire range of the input G, the actual detection range of the G sensor 702 is limited to a predetermined dynamic range (i.e., the range of detectable input G) as shown in FIG. 2. When an input acceleration exceeding this dynamic range is applied, the G sensor 702 cannot detect this acceleration accurately. Furthermore, the G sensor 702 has an inherent resonance point (which is also referred to as resonance frequency) determined according to its structural features. Accordingly, when the input acceleration includes a frequency component corresponding to the resonance point of the G sensor 702, the detecting portion of the G sensor 702 may cause large movement exceeding the dynamic range of the G sensor 702. At this moment, the G sensor 702 cannot perform the detection accurately. The G sensor 702 is, for example, a comb-teeth type G sensor which is arranged so as to detect the acceleration in accordance with a shift amount of the sensing portion. Furthermore, the G sensor 702 of this embodiment includes a communication circuit and an electric power source circuit which are integrated into one package.

The casing 703 is made of a resin material and is integrally molded with the G sensor 702. The casing 703 consists of a primary molded portion 703a surrounding the G sensor 702 and a secondary molded portion 703b surrounding the primary molded portion 703a so as to constitute the external shape of casing 703. First, in manufacturing the sensor device 701, the primary molded portion 703a is formed by integrally molding (primary molding) the G sensor 702, a connector terminal 704 connecting the G sensor 702 to an external device, and a cylindrical metal bush 706 into which a bolt is inserted to fix the casing 703 to a vehicle body with a soft resin material (i.e., first resin material). Then, the secondary molded portion 703b is formed by molding (secondary molding) a hard resin material (i.e., second resin material) around the primary molded portion 703a so as to form the external shape of the sensor device 701. Therefore, a conventionally required post-assembling process for installing the G sensor into the casing can be omitted. The manufacturing man-hours can be reduced. The sensor device 701 can be constituted by a minimum number of requisite components. The manufacturing cost can be greatly reduced.

Regarding the resin material (i.e., first resin material) constituting the primary molded portion 703a, it is for example preferable to use a liquid-state silicone rubber or the like which is a soft resin material used for the molding. Accordingly, the surrounding of G sensor 702 is primarily molded with the first resin material capable of damping high-frequency vibration. Thus, the high-frequency vibration which generally causes resonance can be surely damped. Thus, the sensor device 701 can accurately detect collision and vibration without being adversely influenced by the resonance.

Furthermore, regarding the resin material (i.e., second resin material) constituting the secondary molded portion 703b, it is for example preferable to use a hard resin material such as PBT (polybutylene terphthalate) resin, nylon resin, or the like. Accordingly, the surrounding of primary molded portion 703a is secondarily molded with the second resin material harder than the first resin material. The strength is excellent. Even when the sensor device 701 is disposed in an en engine room located at the front part of a vehicle body for front collision detection or in a crush zone (i.e., corruptible region), such as a pillar or a sidesill, located at the side portion of the vehicle body for side collision detection, it is possible to prevent the casing 703 and the G sensor 702 from being damaged in case of external collision.

The connector terminal 704 is electrically connected to an airbag control apparatus (not shown) via a conductor (not shown), so that an output signal of the G sensor 702 is supplied to the airbag control apparatus. The airbag control apparatus controls expansion of an airbag (not shown) based on the output signal of the G sensor 702.

The sensor device 701 is fixed to the vehicle body by tightening a bolt inserted into the metal bush 706 which is integrally molded with the secondary molded portion 703b of the casing 703.

Next, functions of various portions, in the sensor device 701 having the above-described arrangement, for detecting the collision will be explained with reference to the drawings.

The vibration entered into sensor device 701 in case of vehicle collision or the like includes a variety range of frequency components. The frequency components are roughly classified into two groups; i.e., a group of frequency components necessary for vehicle collision judgment (chiefly residing in a low-frequency band, for example the frequency components less than 1 kHz) and a group of frequency components unnecessary for the collision judgment (chiefly residing in a high-frequency band, for example the frequency components equal to or higher than 1 kHz), as shown in FIG. 3. Furthermore, the G sensor 702 (more specifically, the sensing portion) has a resonance point belonging to the high-frequency band. The casing 703 has a resonance point being set to a frequency level different from the resonance point of the G sensor 702 (according to the example shown in FIG. 3, the resonance point of casing 703 is lower than the resonance point of G sensor 702). The frequency band used for the collision judgment indispensably requires no existence of resonance/damping in the vibration transmission of the casing. On the other hand, at or above the frequency level where the G sensor starts resonating, it is indispensably required that the acceleration entered in the G sensor 702 is sufficiently attenuated so as not to give adverse influence to the detection of the G sensor 702 at the lower frequency side. Furthermore, as the resonance point of the casing is set to be lower than the resonance point of the G sensor, there is no problem even if the casing resonates in the frequency band closer to the resonance point of the casing.

Figure 29:
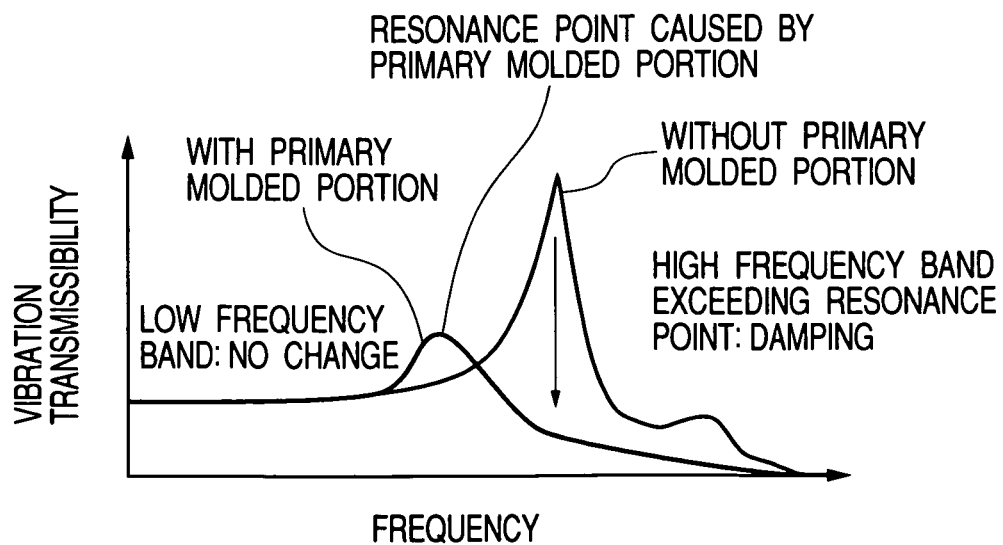
FIG. 29 is a graph showing change in the vibration transfer characteristics of the casing depending on the presence of a primary molded portion in accordance with the fifth embodiment of the present invention.

Next, the sequential flow starting from input of collision G vibration and ending by sensor signal output will be explained with reference to FIGS. 4 to 6A–6D. As shown in FIG. 6A, the collision G vibration includes low-frequency vibration (indicated by a bold line) and high-frequency vibration (indicated by thin line) added or superimposed thereon. When the sensor device 701 receives the vibration transmitted via the vehicle body, the primary molded portion 703a possessing vibration damping effect damps the high-frequency vibration including the resonance point of the G sensor 702, as shown in FIG. 29. In other words, the resonance peak decreases. Thus, as shown in FIG. 6B, the vibration transmitted to the G sensor 702 is substantially limited only to the low-frequency vibration necessary for the collision judgment. As shown in FIG. 6C, the low-frequency vibration transmitted to the G sensor 702 is within the dynamic range. Thus, the G sensor 702 can produce a correct G detection signal. Accordingly, the airbag control apparatus can accurately judge the collision conditions based on the correct G detection signal and can appropriately control the expansion of the airbag.

Furthermore, according to this embodiment, the primary molded portion 703a made of a resin material for surrounding the G sensor 702 brings the effects of maintaining appropriate airtightness and removing the cause of moisture and corrosion.

This invention is not limited to the above-described fifth embodiment and accordingly can be variously modified without departing from the gist of the present invention.

For example, according to the above-described fifth embodiment of this invention, the collision detecting sensor device is used for detecting the acceleration or vibration. However, the sensor device of this embodiment can be applied, for example, to a rollover sensor for detecting angular acceleration, a roll rate sensor, a yaw rate sensor, or the like. In short, this invention is applicable to a sensor device including an electronic sensor outputting an electric signal in accordance with physical displacement of a sensing portion and a casing mounting this electronic sensor.

Furthermore, the resin materials used for forming the primary molded portion 703*a* and the secondary molded portion 703*b* are not limited to the above-described materials. In short, the first resin material forming the primary molded portion 703*a* should have the capability of damping the high-frequency vibration and the second resin material forming the secondary molded portion 703*b* should be hard compared with the first resin material.

As described above, according to the above-described sensor device of this embodiment, in the casing mounting an electronic sensor outputting an electric signal in accordance with the physical displacement of its sensing portion, the surrounding of the electronic sensor is formed by primary molding with the first resin material capable of damping high-frequency vibration, thereby surely damping the high-frequency vibration which generally causes resonance. Thus, the sensor device can accurately detect collision, vibration, angular acceleration, or the like without being adversely influenced by the resonance. Furthermore, the surrounding of the primary molded portion is formed by secondary molding with the second resin material harder than the first resin material. The strength is excellent. Even when the sensor device is disposed in an en engine room located at the front part of a vehicle body or in a crush zone (i.e., corruptible region), such as a pillar, located at the side portion, of the vehicle body, it is possible to prevent the casing from being damaged in case of external collision. Furthermore, at the time the primary molding and the secondary molding are accomplished, the assembling of the sensor device is accomplished. In other words, a conventionally required post-assembling process for installing the electronic sensor into the casing can be omitted. The manufacturing man-hours can be reduced. The sensor device can be constituted by a minimum number of requisite components. The manufacturing cost can be greatly reduced.

Sixth Embodiment

Hereinafter, another preferred embodiment of a collision detecting sensor device embodying the sensor device of the present invention will be explained with reference to the attached drawings.

Figure 30:
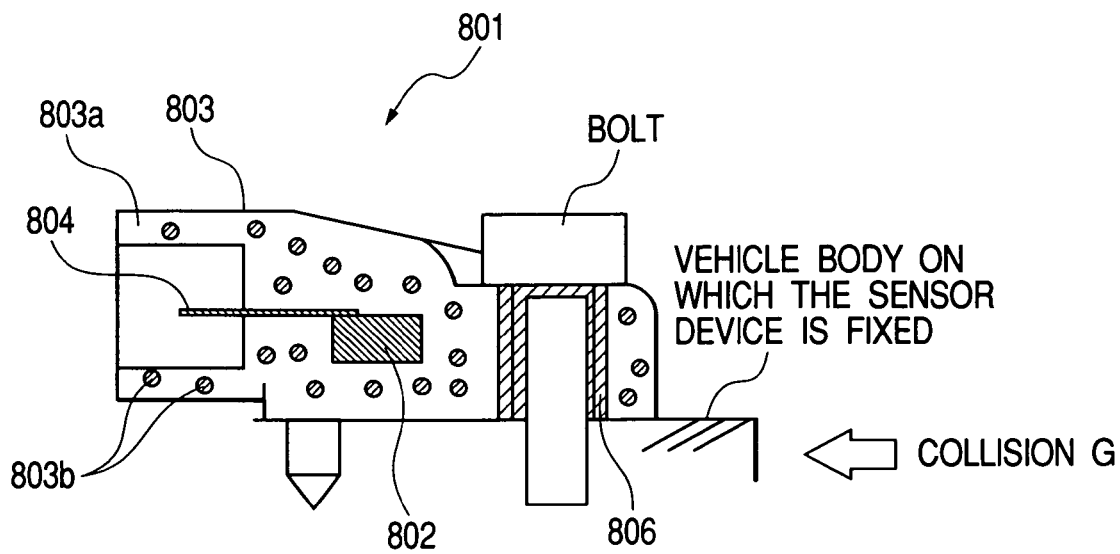
FIG. 30 is a side view showing the schematic arrangement of a collision detecting sensor device in accordance with a sixth embodiment of the present invention.

A collision detecting sensor device (hereinafter, referred to as sensor device) 801 in accordance with a sixth embodiment of the present invention will be explained with reference to FIG. 30. The sensor device 801 is chiefly composed of a G sensor 802 and a casing 803, and is mounted at the front part of a vehicle body or the like to detect collision and output a collision detecting signal to an airbag control apparatus.

Although not shown, the G sensor 802 includes a sensing portion (i.e., a detecting portion) and is arranged to produce an electric signal representing a physical displacement (shift, deformation, etc) of the sensing portion when an acceleration (hereinafter, simply referred to as "G") is entered. Although it is desirable that the G sensor 802 can detect the entire range of the input G, the actual detection range of the G sensor 802 is limited to a predetermined dynamic range (i.e., the range of detectable input G) as shown in FIG. 2. When an input acceleration exceeding this dynamic range is applied, the G sensor 802 cannot detect this acceleration accurately. Furthermore, the G sensor 802 has an inherent resonance point (which is also referred to as resonance frequency) determined according to its structural features. Accordingly, when the input acceleration includes a frequency component corresponding to the resonance point of the G sensor 802, the detecting portion of the G sensor 802 may cause large movement exceeding the dynamic range of the G sensor 802. At this moment, the G sensor 802 cannot perform the detection accurately. The G sensor 802 is, for example, a comb-teeth type G sensor which is arranged so as to detect the acceleration in accordance with a shift amount of the sensing portion. Furthermore, the G sensor 802 of this embodiment includes a communication circuit and an electric power source circuit which are integrated into one package.

The casing 803 is made of a resin material 803*a* containing a vibration damping material 803*b* capable of damping high-frequency vibration so as to be integrally molded with the G sensor 802. More specifically, the sensor device 801 is formed by integrally molding the G sensor 802, a connector terminal 804 connecting the G sensor 802 to an external device, and a cylindrical metal bush 806 into which a bolt is inserted to fix the casing 803 to a vehicle body with a resin material 803*a* containing the vibration damping material 803*b*. Therefore, a conventionally required post-assembling process for installing the G sensor into the casing can be omitted. The manufacturing man-hours can be reduced. The sensor device 801 can be constituted by a minimum number of requisite components. The manufacturing cost can be greatly reduced.

Regarding the resin material 803*a* used for forming the casing 803, it is for example preferable to use a PBT (polybutylene terphthalate) resin, nylon resin, or the like. Regarding the vibration damping material 803*b*, it is preferable to use a thermoplastic elastomer or the like having excellent elasticity.

The connector terminal 804 is electrically connected to an airbag control apparatus.(not shown) via a conductor (not shown), so that an output signal of the G sensor 802 is supplied to the airbag control apparatus. The airbag control apparatus controls expansion of an airbag (not shown) based on the output signal of the G sensor 802.

The sensor device 801 is fixed to the vehicle body by tightening a bolt inserted into the metal bush 806 which is integrally molded with the casing 803.

Next, functions of various portions, in the sensor device 801 having the above-described arrangement, for detecting the collision will be explained with reference to the drawings.

The vibration entered into sensor device 801 in case of vehicle collision or the like includes a variety range of frequency components. The frequency components are roughly classified into two groups; i.e., a group of frequency components necessary for vehicle collision judgment (chiefly residing in a low-frequency band, for example the frequency components less than 1 kHz) and a group of frequency components unnecessary for the collision judgment (chiefly residing in a high-frequency band, for example the frequency components equal to or higher than 1 kHz), as shown in FIG. 3. Furthermore, the G sensor 802 (more specifically, the sensing portion) has a resonance point belonging to the high-frequency band. The casing 803 has a resonance point being set to a frequency level different from the resonance point of the G sensor 802 (according to the example shown in FIG. 3, the resonance point of casing 803 is lower than the resonance point of G sensor 802). The frequency band used for the collision judgment indispensably requires no existence of resonance/damping in the vibration transmission of the casing. On the other hand, at or above the frequency level where the G sensor starts resonating, it is indispensably required that the acceleration entered in the G sensor 802 is sufficiently attenuated so as not to give adverse influence to the detection of the G sensor 802 at the lower frequency side. Furthermore, as the resonance point of the casing is set to be lower than the resonance point of the G sensor, there is no problem even if the casing resonates in the frequency band closer to the resonance point of the casing.

Figure 31:
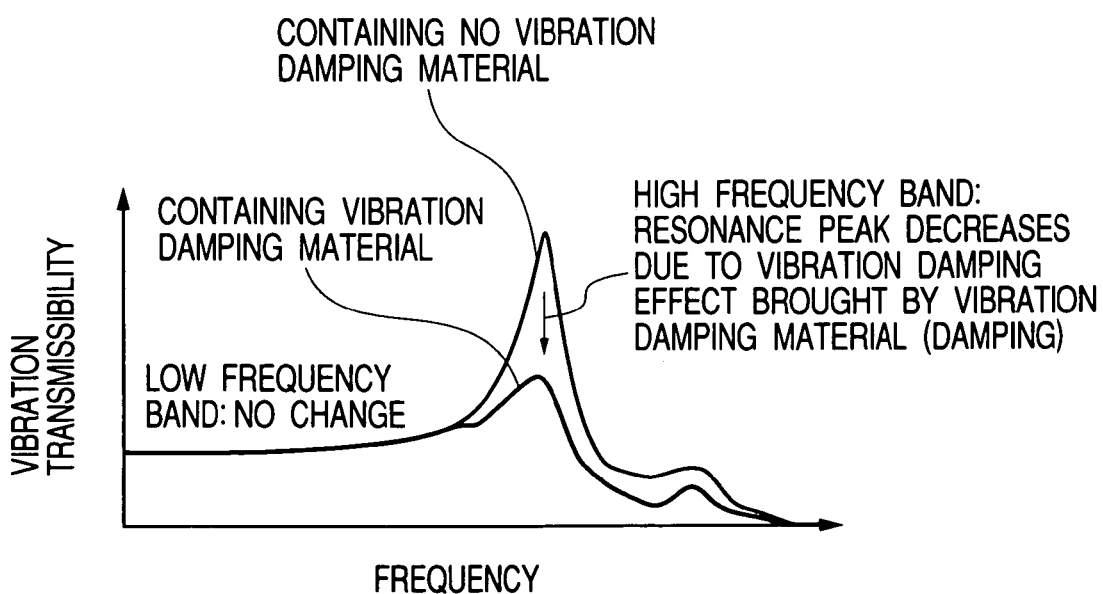
FIG. 31 is a graph showing change in the vibration transfer characteristics of the casing depending on the presence of a vibration damping material in accordance with the sixth embodiment of the present invention.

Next, the sequential flow starting from input of collision G vibration and ending by sensor signal output will be explained with reference to FIGS. 4 to 6A–6D. As shown in FIG. 6A, the collision G vibration includes low-frequency vibration (indicated by a bold line) and high-frequency vibration (indicated by thin line) added or superimposed thereon. When the sensor device 801 receives the vibration transmitted via the vehicle body, the vibration damping material 803b contained in the resin material 803a and possessing vibration damping effect damps the high-frequency vibration including the resonance point of the G sensor 802, as shown in FIG. 31. In other words, the resonance peak decreases. Thus, as shown in FIG. 6B, the vibration transmitted to the G sensor 802 is substantially limited only to the low-frequency vibration necessary for the collision judgment. As shown in FIG. 6C, the low-frequency vibration transmitted to the G sensor 802 is within the dynamic range. Thus, the G sensor 802 can produce a correct G detection signal. Accordingly, the airbag control apparatus can accurately judge the collision conditions based on the correct G detection signal and can appropriately control the expansion of the airbag.

Furthermore, according to this embodiment, the resin material 803a containing the vibration damping material 803b surrounding the G sensor 802 brings the effects of maintaining appropriate airtightness and removing the cause of moisture and corrosion.

This invention is not limited to the above-described sixth embodiment and accordingly can be variously modified without departing from the gist of the present invention.

For example, according to the above-described sixth embodiment of this invention, the collision detecting sensor device is used for detecting the acceleration or vibration. However, the sensor device of this embodiment can be applied, for example, to a rollover sensor for detecting angular acceleration, a roll rate sensor, a yaw rate sensor, or the like. In short, this invention is applicable to a sensor device including an electronic sensor outputting an electric signal in accordance with physical displacement of a sensing portion and a casing mounting this electronic sensor.

As described above, according to the sensor device of this embodiment, an electronic sensor outputs an electric signal in accordance with the physical displacement of its sensing portion, and the casing mounting this electronic sensor is made of a resin material containing a vibration damping material, thereby surely damping the high-frequency vibration which generally causes resonance. Thus, the sensor device can accurately detect collision, vibration, angular acceleration, or the like without being adversely influenced by the resonance.

Seventh Embodiment

Hereinafter, another preferred embodiment of a collision detecting sensor device embodying the sensor device of the present invention will be explained with reference to the attached drawings.

Figure 32:
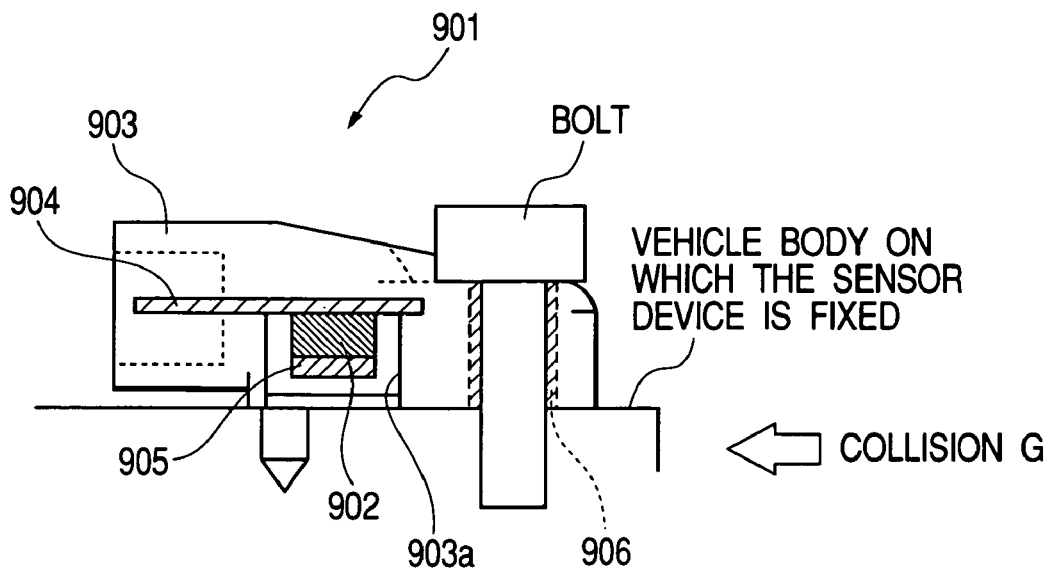
FIG. 32 is a side view showing the schematic arrangement of a collision detecting sensor device in accordance with a seventh embodiment of the present invention.

A collision detecting sensor device (hereinafter, referred to as sensor device) 901 in accordance with a seventh embodiment of the present invention will be explained with reference to FIG. 32. The sensor device 901 is chiefly composed of a G sensor 902 and a casing 903, and is mounted at the front part of a vehicle body or the like to detect collision and output a collision detecting signal to an airbag control apparatus.

Although not shown, the G sensor 902 includes a sensing portion (i.e., a detecting portion) and is arranged to produce an electric signal representing a physical displacement (shift, deformation, etc) of the sensing portion when an acceleration (hereinafter, simply referred to as "G") is entered. Although it is desirable that the G sensor 902 can detect the entire range of the input G, the actual detection range of the G sensor 902 is limited to a predetermined dynamic range (i.e., the range of detectable input G) as shown in FIG. 2. When an input acceleration exceeding this dynamic range is applied, the G sensor 902 cannot detect this acceleration accurately. Furthermore, the G sensor 902 has an inherent resonance point (which is also referred to as resonance frequency) determined according to its structural features. Accordingly, when the input acceleration includes a frequency component corresponding to the resonance point of the G sensor 902, the detecting portion of the G sensor 902 may cause large movement exceeding the dynamic range of the G sensor 902. At this moment, the G sensor 902 cannot perform the detection accurately. The G sensor 902 is, for example, a comb-teeth type G sensor which is arranged so as to detect the acceleration in accordance with a shift amount of the sensing portion. Furthermore, the G sensor 902 of this embodiment includes a communication circuit and an electric power source circuit which are integrated into one package.

The casing 903 is a resin molded product in which the G sensor 902 is mounted. For example, the casing 903 is made of a PBT (polybutylene terphthalate) resin, nylon resin, or the like. The casing 903 has a G sensor chamber 903a which opens toward a lower surface side of the casing 903. A connector terminal 904 and a cylindrical metal bush 906 are embedded in the casing 903. The G sensor 902 is electrically connected to the outside via the connector terminal 904. A bolt is inserted into the metal bush 906 to fix the casing 903 to a vehicle body. Part of the connector terminal 904 is exposed inside the G sensor chamber 903a. The G sensor 902 is located in the G sensor chamber 903a and is fixed to the connector terminal 904 by soldering or the like for providing electrical connection.

The connector terminal 904 is electrically connected to an airbag control apparatus (not shown) via a conductor (not shown), so that an output signal of the G sensor 902 is supplied to the airbag control apparatus. The airbag control apparatus controls expansion of an airbag (not shown) based on the output signal of the G sensor 902.

Furthermore, a dynamic damper is bonded to an opposite surface of the G sensor 902 where the connector terminal 904 is not electrically connected and is not fixed. The dynamic damper 905 is tuned to the resonance point of the sensing portion of the G sensor. Accordingly, when the high-frequency vibration including the resonance point of the G sensor 902 is transmitted via the casing 903, the dynamic damper 905 itself resonates so as to surely damp the high-frequency vibration. Thus, the G sensor 902 can detect collision and vibration without being adversely influenced by the resonance. Practically, the dynamic damper 905 can be constituted with a plate or sheet elastic member. For example, it is possible to use a rubber plate, a leaf spring, or the like. Furthermore, it is possible to tune the dynamic damper 905 to the sensing portion of the G sensor 902 by adequately adjusting the hardness, physical values including dielectric dissipation factor, shape, size, etc. of the rubber plate or the like.

The sensor device 901 is fixed to the vehicle body by tightening a bolt inserted into the metal bush 906 which is integrally molded with the casing 903.

Next, functions of various portions, in the sensor device 901 having the above-described arrangement, for detecting the collision will be explained with reference to the drawings.

The vibration entered into sensor device 901 in case of vehicle collision or the like includes a variety range of frequency components. The frequency components are roughly classified into two groups; i.e., a group of frequency components necessary for vehicle collision judgment (chiefly residing in a low-frequency band, for example the frequency components less than 1 kHz) and a group of frequency components unnecessary for the collision judgment (chiefly residing in a high-frequency band, for example the frequency components equal to or higher than 1 kHz), as shown in FIG. 3. Furthermore, the G sensor 902 (more specifically, the sensing portion) has a resonance point belonging to the high-frequency band. The casing 903 has a resonance point being set to a frequency level different from the resonance point of the G sensor 902 (according to the example shown in FIG. 3, the resonance point of casing 903 is lower than the resonance point of G sensor 902). The frequency band used for the collision judgment indispensably requires no existence of resonance/damping in the vibration transmission of the casing. On the other hand, at or above the frequency level where the G sensor starts resonating, it is indispensably required that the acceleration entered in the G sensor 902 is sufficiently attenuated so as not to give adverse influence to the detection of the G sensor 902 at the lower frequency side. Furthermore, as the resonance point of the casing is set to be lower than the resonance point of the G sensor, there is no problem even if the casing resonates in the frequency band closer to the resonance point of the casing.

Figure 33:
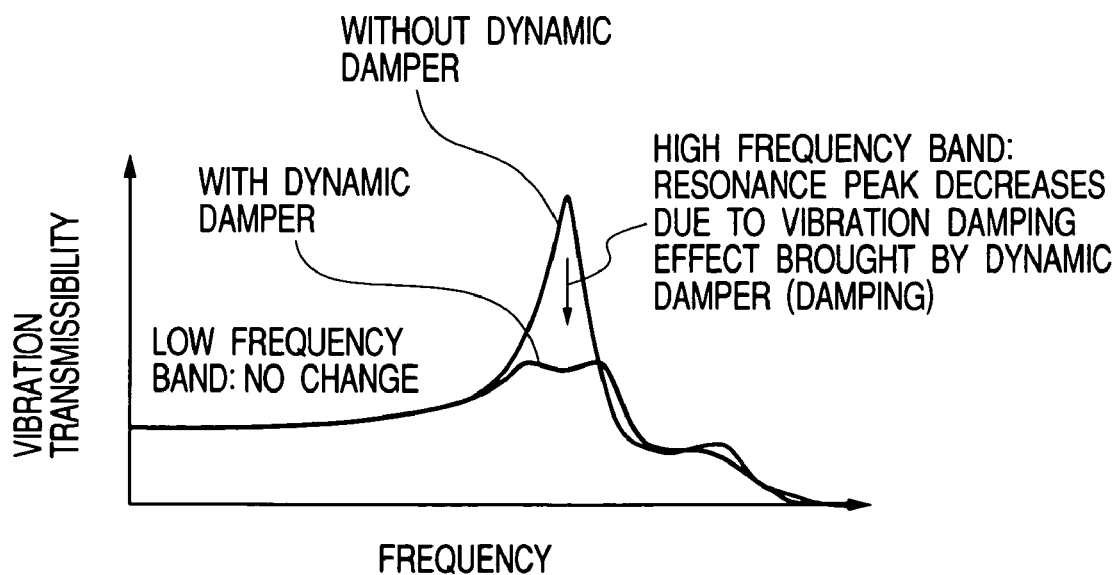
FIG. 33 is a graph showing change in the vibration transfer characteristics of the casing depending on the presence of a dynamic damper in accordance with the seventh embodiment of the present invention.

Next, the sequential flow starting from input of collision G vibration and ending by sensor signal output will be explained with reference to FIGS. 4 to 6A–6D. As shown in FIG. 6A, the collision G vibration includes low-frequency vibration (indicated by a bold line) and high-frequency vibration (indicated by thin line) added or superimposed thereon. When the sensor device 901 receives the vibration transmitted via the vehicle body, the dynamic damper 905 possessing vibration damping effect damps the high-frequency vibration including the resonance point of the G sensor 902, as shown in FIG. 33. In other words, the resonance peak decreases. Thus, as shown in FIG. 6B, the vibration transmitted to the G sensor 902 is substantially limited only to the low-frequency vibration necessary for the collision judgment. As shown in FIG. 6C, the low-frequency vibration transmitted to the G sensor 902 is within the dynamic range. Thus, the G sensor 902 can produce a correct G detection signal. Accordingly, the airbag control apparatus can accurately judge the collision conditions based on the correct G detection signal and can appropriately control the expansion of the airbag.

Figure 34:
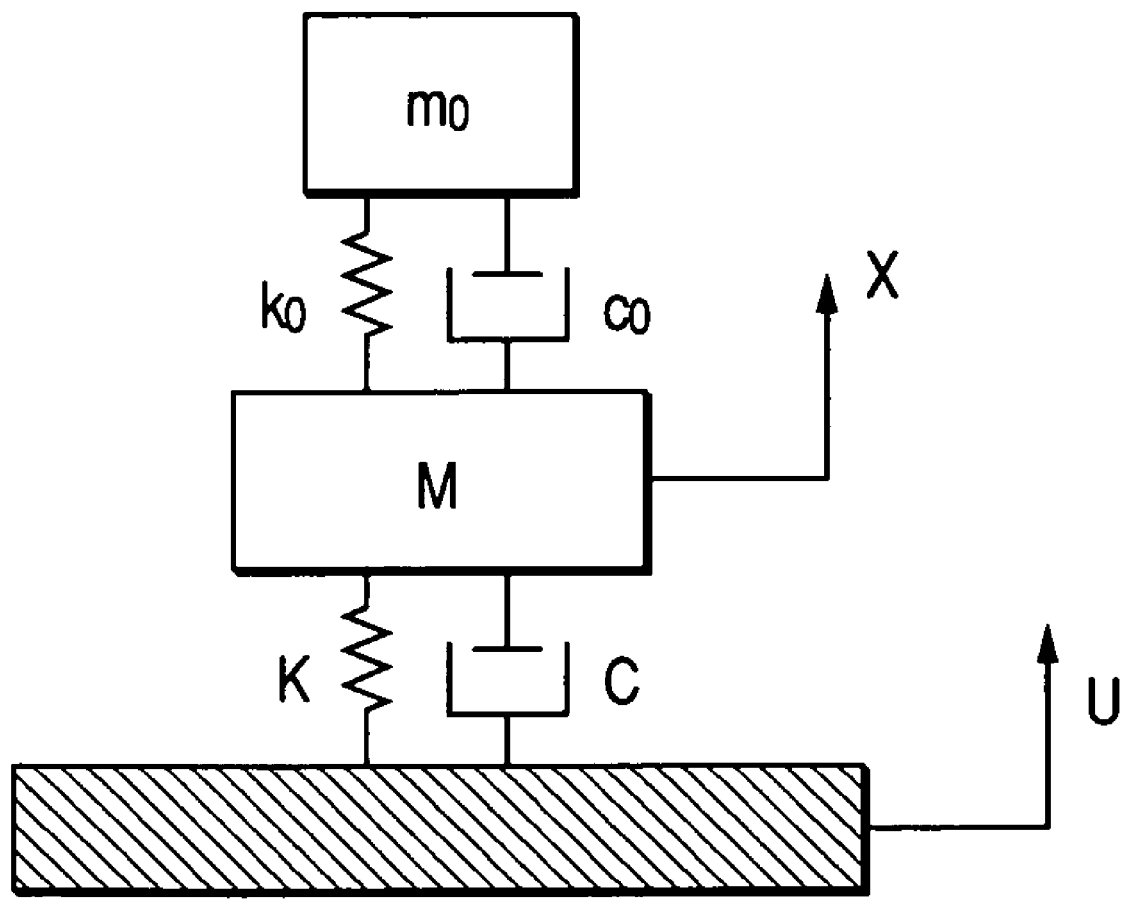
FIG. 34 is a view explaining a model consisting of the G sensor and the dynamic damper in accordance with the seventh embodiment of the present invention.

Furthermore, this embodiment can be expressed as a model shown in FIG. 34 which includes dynamic damper mass $m_0$, dynamic damper spring constant $k_0$, dynamic damper damping factor $c_0$, G sensor mass M, as well as spring constant K and damping factor C under a condition that the G sensor is installed in the casing.

This invention is not limited to the above-described seventh embodiment and accordingly can be variously modified without departing from the gist of the present invention.

For example, according to the above-described seventh embodiment of this invention, the collision detecting sensor device is used for detecting the acceleration or vibration. However, the sensor device of this embodiment can be applied, for example, to a rollover sensor for detecting angular acceleration, a roll rate sensor, a yaw rate sensor, or the like. In short, this invention is applicable to a sensor device including an electronic sensor outputting an electric signal in accordance with physical displacement of a sensing portion and a casing mounting this electronic sensor.

Although the above-described embodiment discloses the dynamic damper 905 constituted by a rubber plate or a leaf spring, the material and shape of the dynamic damper is not limited to these members. In short, the dynamic damper of the present invention should be made of any member having the capability as a dynamic damper (e.g., elastic member), which is tunable to the resonance point of the G sensor and is attachable to the G sensor 902.

As described above, according to the sensor device of this invention, the electronic sensor outputs an electric signal in accordance with the physical displacement of its sensing portion, and the electronic sensor is mounted in the casing. The dynamic damper, being tuned to the resonance point of the sensing portion, is attached to the electronic sensor. Thus, it becomes possible to surely damp the high-frequency vibration which generally causes resonance. The sensor device can accurately detect collision, vibration, angular acceleration, or the like without being adversely influenced by the resonance.

What is claimed is:

1. A sensor device comprising:
   an electronic collision sensor for outputting an electric signal in accordance with a physical displacement of a sensing portion of the sensor, the displacement being caused by collision with an object;
   a casing in which said electronic collision sensor is mounted; and
   a vibration damping member provided between at least part of said electronic collision sensor and said casing for damping a high-frequency vibration in a frequency band equal to or higher than 1 kHz such that the high-frequency vibration transmitted to the electronic collision sensor through said casing is suppressed.

2. The sensor device in accordance with claim 1, wherein said vibration damping member is a potting material, and said electronic collision sensor is surrounded by said potting material.

3. The sensor device in accordance with claim 1, wherein said vibration damping member is a plate or sheet vibration proofing material or a molded vibration proofing material integrated together with said electronic collision sensor, and said electronic collision sensor is fixed to said easing via said vibration proofing material.

4. The sensor device in accordance with claim 1, wherein said vibration damping member is a lead member having elasticity which is connected to said electronic collision sensor at least at a portion thereof and is fixed to said casing at least at the other portion thereof, and said lead member and said electronic collision sensor are arranged so as to cooperatively constitute a spring-mass system consisting of both a spring of said lead member and amass of said electronic collision sensor for damping the high-frequency vibration.

5. The sensor device in accordance with claim 4, wherein said lead member is integrally molded with said casing.

6. The sensor device in accordance with claim 1, wherein said electronic collision sensor includes a detecting portion, a communicating portion, and an electric power source circuit integrated together as one package, and is directly attached to said casing.

7. The sensor device in accordance with claim 1, wherein said electronic collision sensor is mounted on a substrate and is fixed to said casing through said substrate.

8. The sensor device in accordance with claim 1, wherein physical properties of said vibration damping member including a hardness, a dielectric dissipation factor, a shape and a size are configured so as to enhance the properties of said vibration damping member for damping the high-frequency vibration including vibration at a resonance point of said electronic collision sensor.

9. A ceramic package for an electronic component, comprising: a main body on which an electronic component is mounted;
a metallic electrode attached to said main body prior to the mounting of said electronic component on said main body, said electronic component being mounted on said main body so as to be electrically connected with said metallic electrode; and
a lead bonded to said metallic electrode by welding after the mounting of said electronic component on said main body such that said metallic electrode prevents an influence of the welding from being exerted on said electronic component.

10. The electronic component mounting ceramic package in accordance with claim 9, wherein said metallic electrode is brazed to said main body.

11. A sensor device comprising;
an electronic sensor for outputting an electric signal in accordance with physical displacement of a sensing portion; and
a casing in which said electronic sensor is mounted, wherein casing comprises:
a primary molded portion formed by primary molding so as to surround said electronic sensor with a first resin material capable of damping high-frequency vibration, and
a secondary molded portion formed by secondary molding so as to surround said primary molded portion with a second resin material harder than said first resin material.

12. The sensor device in accordance with claim 11, wherein said first resin material is a liquid-state silicone rubber.

13. A sensor device, comprising:
an electronic collision sensor for outputting an electric signal in accordance with a physical displacement of a sensing portion caused by collision with an object; and
a casing in which said electronic collision sensor is mounted,
wherein said casing is made of a resin material containing a vibration damping material capable of damping a high-frequency vibration in a frequency band equal to or higher than 1 kHz to suppress the high-frequency vibration transmitted to the electronic collision sensor through said casing.

14. The sensor device in accordance with claim 13, wherein said electronic collision sensor is integrally molded with said resin material containing the vibration damping material.

15. The sensor device in accordance with claim 13, wherein said vibration damping material is a thermoplastic elastomer.

16. A sensor device comprising:
an electronic sensor for outputting an electric signal in accordance with physical displacement of a sensing portion;
a casing in which said electronic sensor is mounted and
a dynamic damper attached to said electronic sensor, and said dynamic damper being tuned to a resonance point of said sensing portion.

17. The sensor device in accordance with claim 16, wherein said dynamic damper is made of a plate or sheet elastic member.

18. A sensor device comprising:
an electronic sensor for outputting an electric signal in accordance with physical displacement of a sensing portion;
a casing in which said electronic sensor is mounted; and
a vibration damping member provided between at least part of said electronic sensor and said casing for damping a high-frequency vibration,
wherein physical properties of said vibration damping member including a hardness, a dielectric dissipation factor, a shape and a size are configured so as to enhance the properties of said vibration damping member for damping the high-frequency vibration including vibration at a resonance point of said electronic sensor.

19. The sensor device in accordance with claim 18, wherein said vibration damping member is a potting material, and said electronic sensor is surrounded by said potting material.

20. The sensor device in accordance with claim 18, wherein said vibration damping member is a plate or sheet vibration proofing material or a molded vibration proofing material integrated together with said electronic sensor, and said electronic sensor is fixed to said casing via said vibration proofing material.

21. The sensor device in accordance with claim 18, wherein said vibration damping member is a lead member having elasticity which is connected to said electronic sensor at least at a portion thereof and is fixed to said casing at least at the other portion thereof, and said lead member and said electronic sensor are arranged so as to cooperatively constitute a spring-mass system consisting of both spring of said lead member and mass of said electronic sensor for damping the high-frequency vibration.

22. The sensor device in accordance with claim 21, wherein said lead member is integrally molded with said casing.

23. The sensor device in accordance with claim 18, wherein said electronic sensor includes a detecting portion, a communicating portion, and an electric power source circuit integrated together as one package, said electronic sensor being directly attached to said casing.

24. The sensor device in accordance with claim 18, wherein said electronic sensor is mounted on a substrate and is fixed to said casing through said substrate.

25. A sensor device, comprising:
an electronic sensor for outputting an electric signal in accordance with physical displacement of a sensing portion; and
a casing in which said electronic sensor is mounted,
wherein said casing is made of a resin material containing a vibration damping material capable of damping a high-frequency vibration in a frequency band equal to or higher than 1 kHz, and said electronic sensor is integrally molded with said resin material containing the vibration damping material.

26. The electronic component mounting ceramic package in accordance with claim 9, wherein said lead is bonded to said metallic electrode by resistance welding such that a first welding electrode and a second welding electrode are, respectively, connected to said metallic electrode, current flow between the welding electrodes through said metallic electrode to generate heat required in the resistance welding, and the welding electrodes are detached from said metallic electrode.

27. The sensor device in accordance with claim 25, wherein the sensing portion has a resonance point belonging to the frequency band.

* * * * *